(12) United States Patent
Caveney

(10) Patent No.: US 11,273,558 B2
(45) Date of Patent: Mar. 15, 2022

(54) SUBSTRATE TRANSPORT APPARATUS

(71) Applicant: BROOKS AUTOMATION, INC., Chelmsford, MA (US)

(72) Inventor: Robert T. Caveney, Windham, NH (US)

(73) Assignee: Brooks Automation US, LLC, Chelmsford, MA (US)

( * ) Notice: Subject to any disclaimer, the term of this patent is extended or adjusted under 35 U.S.C. 154(b) by 777 days.

(21) Appl. No.: 15/110,130

(22) PCT Filed: Jan. 16, 2015

(86) PCT No.: PCT/US2015/011764
§ 371 (c)(1),
(2) Date: Jul. 7, 2016

(87) PCT Pub. No.: WO2015/109189
PCT Pub. Date: Jul. 23, 2015

(65) Prior Publication Data
US 2016/0325440 A1 Nov. 10, 2016

Related U.S. Application Data

(60) Provisional application No. 61/928,681, filed on Jan. 17, 2014.

(51) Int. Cl.
*H01L 21/677* (2006.01)
*B25J 18/04* (2006.01)

(52) U.S. Cl.
CPC ........ *B25J 18/04* (2013.01); *H01L 21/67742* (2013.01); *H01L 21/67766* (2013.01)

(58) Field of Classification Search
CPC ................... H01L 21/67748; H01L 21/67754
See application file for complete search history.

(56) References Cited

U.S. PATENT DOCUMENTS

| 6,109,860 A | 8/2000 | Ogawa et al. |
| 7,648,327 B2 * | 1/2010 | Bonora ............ H01L 21/67766 |
| | | 414/744.3 |

(Continued)

FOREIGN PATENT DOCUMENTS

| CN | 1561535 | 1/2005 |
| CN | 103053017 | 4/2013 |

(Continued)

OTHER PUBLICATIONS

International Search Report, International Application No. PCT/US2015/011764, dated Apr. 10, 2015.

*Primary Examiner* — Gerald McClain
(74) *Attorney, Agent, or Firm* — Perman & Green, LLP; Colin C. Durham

(57) ABSTRACT

A transport apparatus including a frame, a drive section connected to the frame, the drive section having at least one drive axis, at least one arm having an end effector configured for holding a substrate, the at least one arm being connected to the drive section by a transmission link and having at least one degree of freedom axis effecting extension and retraction of the end effector with respect to the at least one arm, and a bearing connected to the frame and the end effector, the bearing defining a guideway that defines the at least one degree of freedom axis.

21 Claims, 19 Drawing Sheets

(56) References Cited

U.S. PATENT DOCUMENTS

| | | | |
|---|---|---|---|
| 7,946,799 B2* | 5/2011 | Uratani | H01L 21/67742 |
| | | | 414/744.3 |
| 8,011,874 B2* | 9/2011 | Uratani | B25J 18/04 |
| | | | 414/744.3 |
| 9,188,973 B2* | 11/2015 | Tenney | G06T 7/12 |
| 2003/0129045 A1 | 7/2003 | Bonora et al. | |
| 2004/0001750 A1 | 1/2004 | Kremerman | |
| 2005/0036877 A1 | 2/2005 | Ogawa et al. | |
| 2006/0021387 A1 | 9/2006 | Saeki et al. | |
| 2009/0087288 A1* | 4/2009 | Hofmeister | B25J 9/126 |
| | | | 414/222.02 |
| 2010/0111649 A1* | 5/2010 | Minami | B25J 9/0048 |
| | | | 414/217 |
| 2010/0178146 A1 | 7/2010 | Kremerman et al. | |
| 2010/0329827 A1 | 12/2010 | Hoey et al. | |
| 2012/0128450 A1 | 5/2012 | Caveney et al. | |
| 2012/0021614 A1 | 8/2012 | Bonora et al. | |
| 2013/0213171 A1 | 8/2013 | Kwag et al. | |
| 2014/0105716 A1* | 4/2014 | Lee | H01L 21/68707 |
| | | | 414/749.1 |

FOREIGN PATENT DOCUMENTS

| | | | | | |
|---|---|---|---|---|---|
| JP | 07504128 | 5/1995 | | | |
| JP | 2005116665 | 4/2005 | | | |
| JP | 2005125479 | 5/2005 | | | |
| JP | 2005125479 A | * | 5/2005 | | B25J 9/042 |
| JP | 2006240867 | 9/2006 | | | |
| JP | 2009023021 | 2/2009 | | | |
| JP | 2009038268 | 2/2009 | | | |
| JP | 2014520351 | 8/2014 | | | |
| KR | 20130041326 | 4/2013 | | | |
| KR | 101268111 | 5/2013 | | | |
| WO | 9415760 | 7/1994 | | | |
| WO | 2008140093 | 11/2008 | | | |
| WO | 2012026293 | 3/2012 | | | |
| WO | 2013009510 | 1/2013 | | | |
| WO | 2013120054 | 8/2013 | | | |

\* cited by examiner

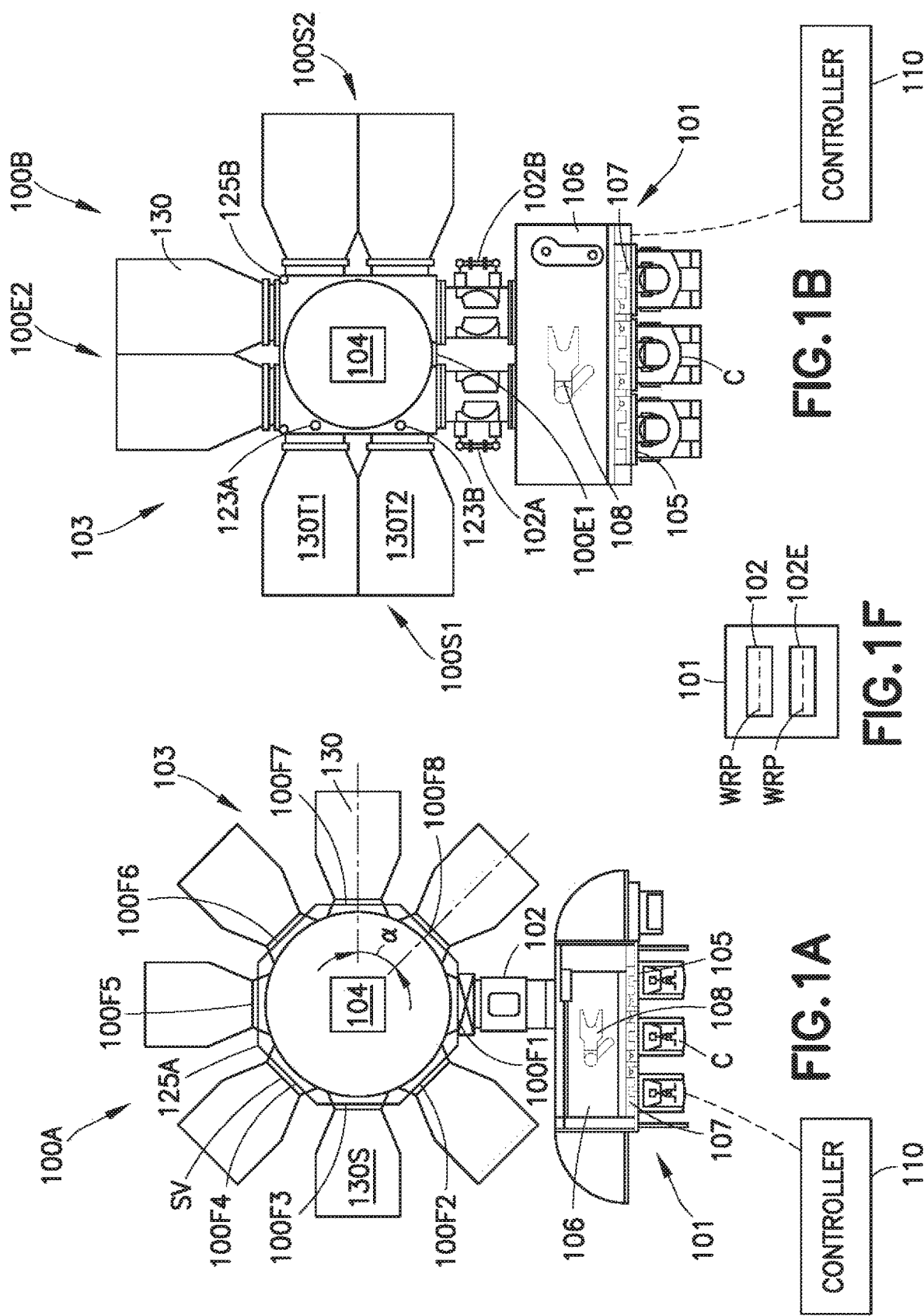

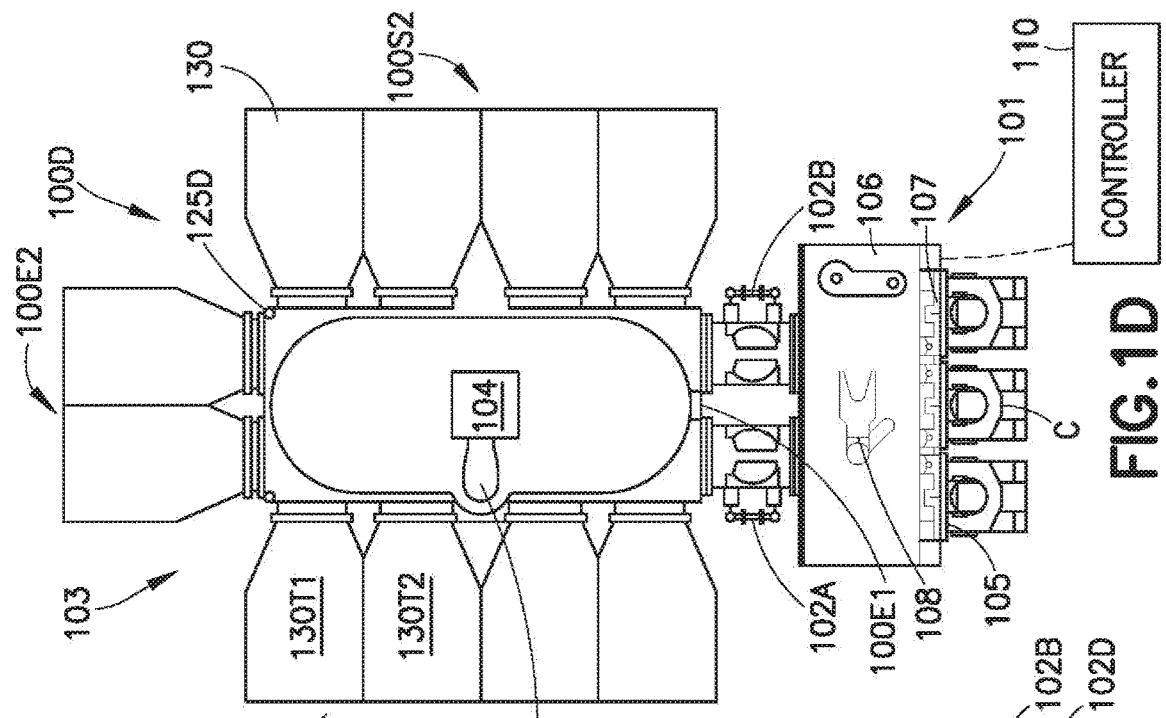
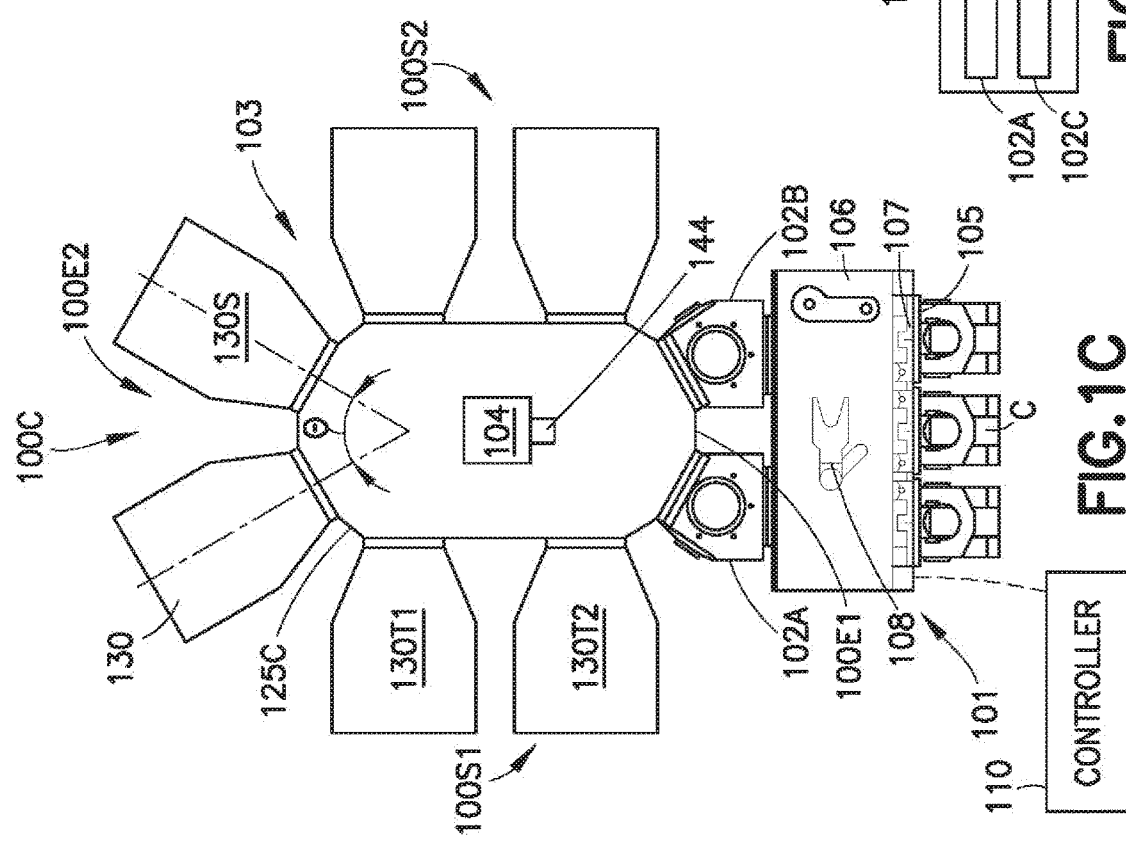

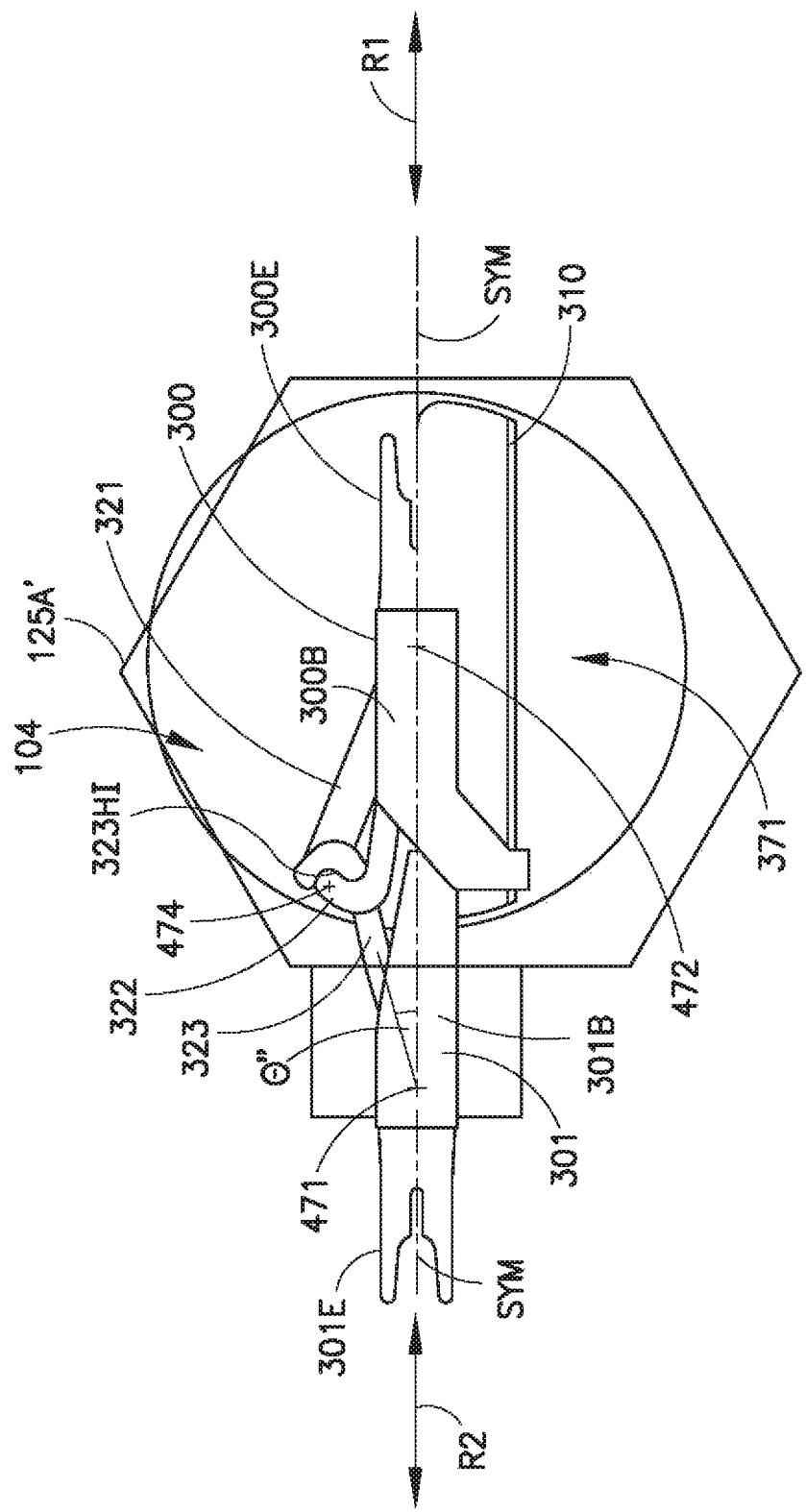

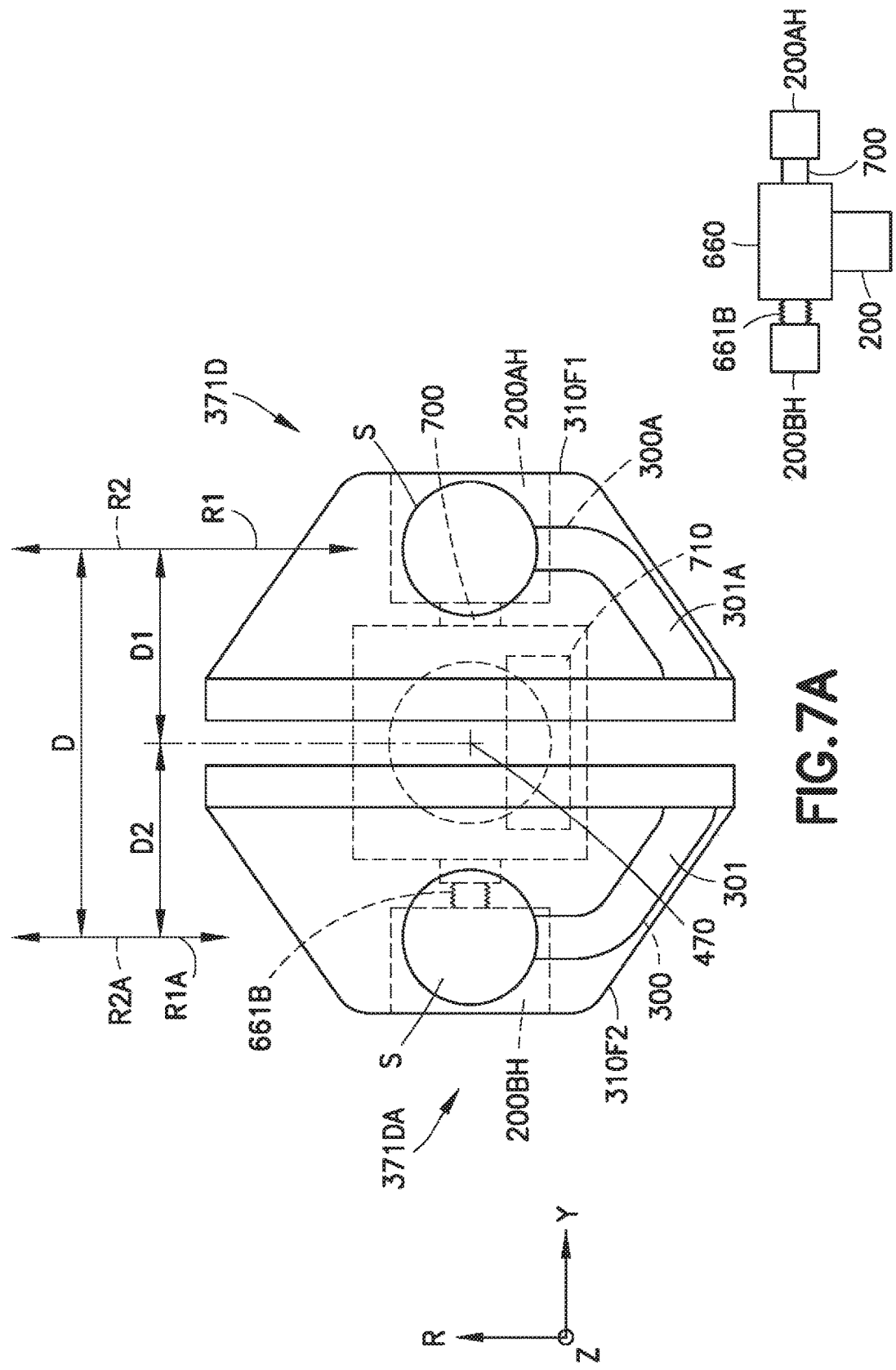

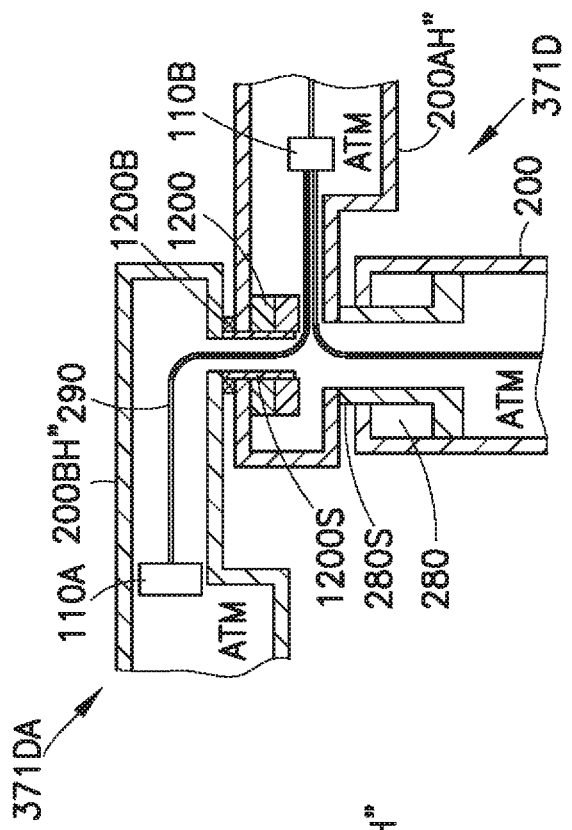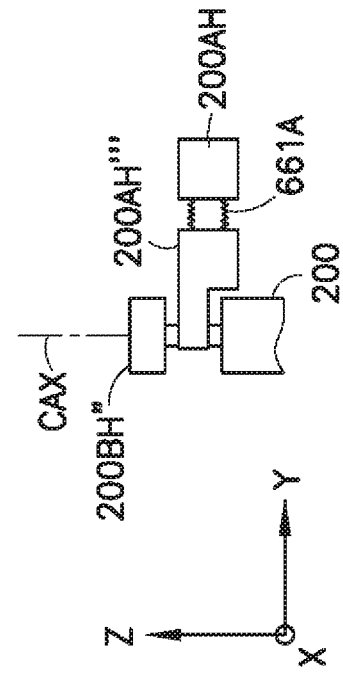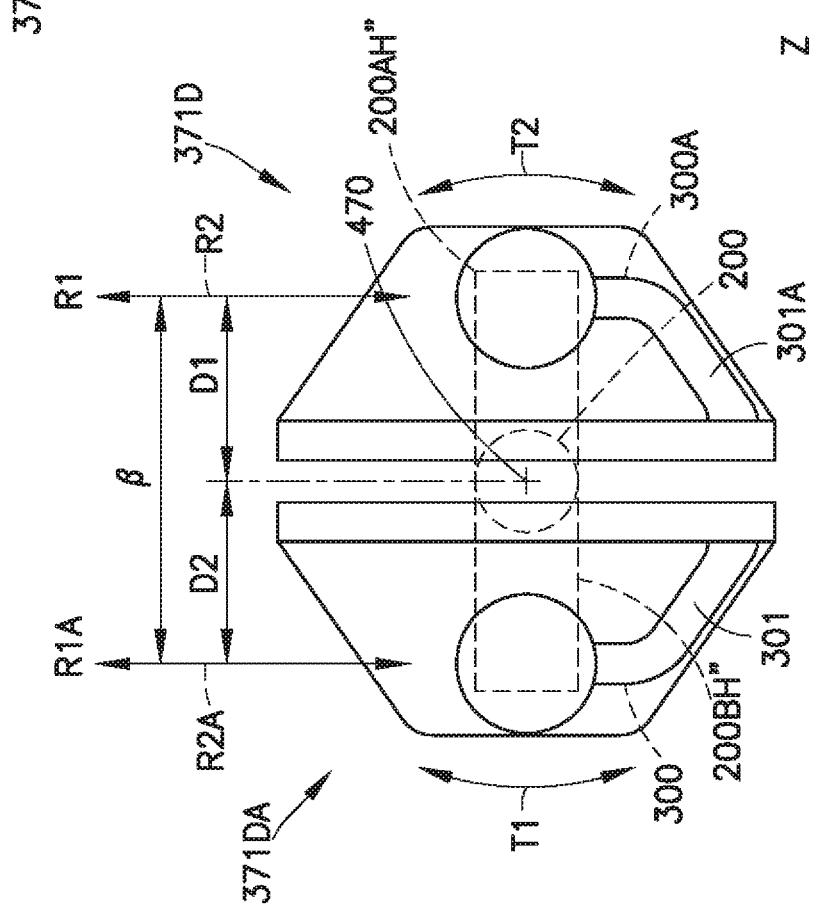

SUBSTRATE TRANSPORT APPARATUS

CROSS-REFERENCE TO RELATED APPLICATION

This application is the National Stage of International application No. PCT/US2015/011764, having an International Filing Date of 16 Jan. 2015, which designates the United States of America, and which International Application was published under PCT Article 21(2) as WO Publication No. 2015/109189 A1, which claims priority from, and the benefit of U.S. Provisional Patent Application No. 61/928,681 filed on Jan. 17, 2014, the disclosures of which are incorporated herein by reference in their entireties.

BACKGROUND

1. Field

The exemplary embodiments generally relate to robotic systems and, more particularly, to robotic transport apparatus.

2. Brief Description of Related Developments

More precise repeatability regarding substrate positioning is desired in, for example, semiconductor substrate processing. As an example, repeatability in placement is requested within the range of about 5 micron to about 25 micron which is generally a challenge for conventional substrate transport apparatus.

It would be advantageous to provide a robotic transport arm that is lightweight, stiff with rigid drive links connecting an end effector of the arm with a drive to, for example, substantially remove an impact of hysteresis and lack of stiffness in the arm linkage or coupling between the drive and the arm linkage.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of processing apparatus incorporating aspects of the disclosed embodiment;

FIGS. 1E and 1F are schematic illustrations of portions of the processing apparatus of FIGS. 1A-1D;

FIGS. 3A-3B are schematic illustrations of a robotic transport in accordance with aspects of the disclosed embodiment;

FIGS. 7A and 7B are schematic illustrations of a robotic transport in accordance with aspects of the disclosed embodiment;

FIGS. 9A-9C are schematic illustrations of a robotic transport in accordance with aspects of the disclosed embodiment.

DETAILED DESCRIPTION

Figure 2A:
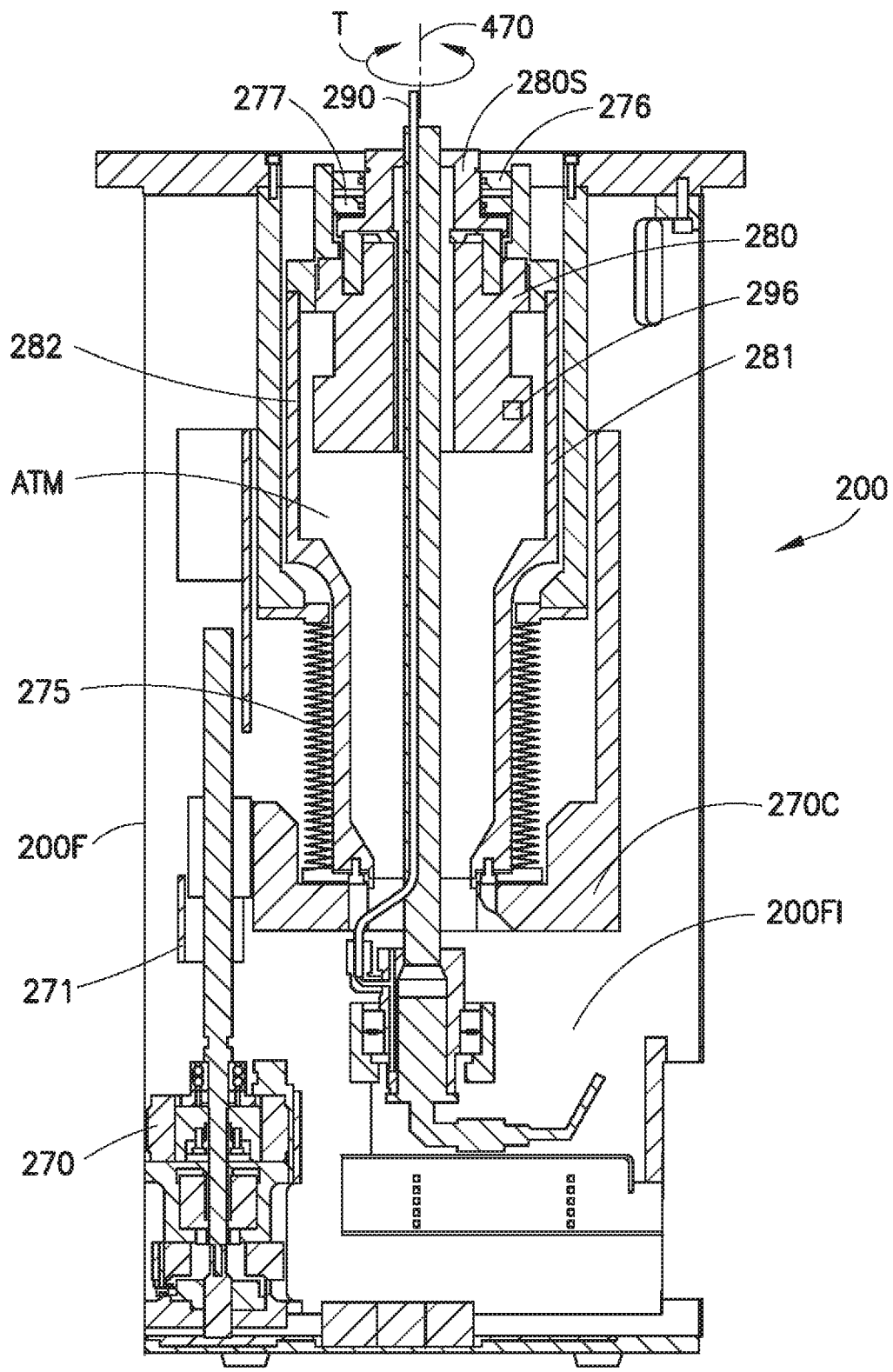
FIG. 2A is a schematic illustration of a robotic transport drive section in accordance with aspects of the disclosed embodiment.

FIGS. 1A-1D are schematic illustrations of substrate processing apparatus in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

The processing apparatus 100A, 100B, 100C, 100D, such as for example a semiconductor tool station, is shown in accordance with aspects of the disclosed embodiment. Although a semiconductor tool station is shown in the drawings, the aspects of the disclosed embodiment described herein can be applied to any tool station or application employing robotic manipulators. In one aspect the processing apparatus 100A, 100B, 100C, 100D are shown as having cluster tool arrangements (e.g. having substrate holding stations connected to a central chamber) while in other aspects the processing apparatus may be a linearly arranged tool, however the aspects of the disclosed embodiment may be applied to any suitable tool station. The apparatus 100A, 100B, 100C, 100D generally include an atmospheric front end 101, at least one vacuum load lock 102, 102A, 102B and a vacuum back end 103. The at least one vacuum load lock 102, 102A, 102B may be coupled to any suitable port(s) or opening(s) of the front end 101 and/or back end 103 in any suitable arrangement. For example, in one aspect the one or more load locks 102, 102A, 102B may be arranged in a common horizontal plane in a side by side arrangement as can be seen in FIGS. 1B-1C. In other aspects the one or more load locks may be arranged in a grid format such that at least two load locks 102A, 102B, 102C, 102D are arranged in rows (e.g. having spaced apart horizontal planes) and columns (e.g. having spaced apart vertical planes) as shown in FIG. 1E. In still other aspects the one or more load lock may be a single in-line load lock 102 as shown in FIG. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D in other aspects the one or more load lock may be arranged on any number of sides 100S1, 100S2, ends 100E1, 100E2 or facets 100F1-100F8 of the transport chamber 125A, 125B, 125C, 125D. Each of the at least one load lock may also include one or more wafer/substrate resting planes WRP (FIG. 1F) in which substrates are held on suitable supports within the respective load lock. In other aspects, the tool station may have any suitable configuration. The components of each of the front end 101, the at least one load lock 102, 102A, 102B and back end 103 may be connected to a controller 110 which may be part of any suitable control architecture such as, for example, a clustered architecture control. The control system may be a closed loop controller having a master controller (which in one aspect may be controller 110), cluster controllers and autonomous remote controllers (which in one aspect may be controllers 110A, 110B illustrated in FIGS. 8B and 9B) such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B may be located between and connected to the mini-environment 106 and the back end 103. In other aspects the load ports 105 may be coupled substantially directly to the at least one load lock 102, 102A, 102B or the transport chamber 125A, 125B, 125C, 125D where the substrate carrier C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transfer apparatus may be provided within the load lock or otherwise have access to the carrier C for transferring substrates to and from the substrate carrier C. It is noted that the term vacuum as used herein may denote a high vacuum such as $10^{-5}$ Torr or below in which the substrates are processed. The at least one load lock 102, 102A, 102B generally includes atmospheric and vacuum slot valves. The slot valves of the load locks 102, 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D may be located in the same plane, different vertically stacked planes or a combination of slot valves located in the same plane and slot valves located in different vertically stacked planes (as described above with respect to the load ports) to accommodate transfer of substrates to and from at least the processing stations 130 and load locks 102, 102A, 102B coupled to the transport chamber 125A, 125B, 125C, 125D. The at least one load lock 102, 102A, 102B (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, one or more processing station(s) 130 and any suitable number of transfer unit modules 104 that includes one or more transfer robots which may include one or more aspects of the disclosed embodiments described herein. The transport chamber 125A, 125B, 125C, 125D may have any suitable shape and size that, for example, complies with SEMI standard E72 guidelines. The transfer unit module(s) 104 and the one or more transfer robot will be described below and may be located at least partly within the transport chamber 125A, 125B, 125C, 125D to transport substrates between the load lock 102, 102A, 102B (or between a cassette C located at a load port) and the various processing stations 130. In one aspect the transfer unit module 104 may be removable from the transport chamber 125A, 125B, 125C, 125D as modular unit such that the transfer unit module 104 complies with SEMI standard E72 guidelines.

The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 130 are communicably connected to the transport chamber 125A, 125B, 125C, 125D in any suitable manner, such as through slot valves SV, to allow substrates to be passed from the transport chamber 125 to the processing stations 130 and vice versa. The slot valves SV of the transport chamber 125 may be arranged to allow for the connection of twin (e.g. more than one substrate processing chamber located within a common housing) or side-by-side process stations 130T1, 130T2, single process stations 130S and/or stacked process modules/load locks (FIGS. 1E and 1F).

It is noted that the transfer of substrates to and from the processing station 130, load locks 102, 102A, 102B (or cassette C) coupled to the transfer chamber 125A, 125B, 125C, 125D may occur when one or more arms of the transfer unit module 104 are aligned with a predetermined processing station 130. In accordance with aspects of the disclosed embodiment one or more substrates may be transferred to a respective predetermined processing station 130 individually or substantially simultaneously (e.g. such as when substrates are picked/placed from side-by-side or tandem processing stations as shown in FIGS. 1B, 1C and 1D. In one aspect the transfer unit module 104 may be mounted on a boom arm 143 (see e.g. FIG. 1D) or linear carriage 144 such as that described in U.S. provisional patent application Nos. 61/892,849 entitled "Processing Apparatus" and filed on Oct. 18, 2013 and 61/904,908 entitled "Processing Apparatus" and filed on Nov. 15, 2013 and International patent application number PCT/US13/25513 entitled "Substrate Processing Apparatus" and filed on Feb. 11, 2013, the disclosures of which are incorporated herein by reference in their entireties.

Figure 2B:
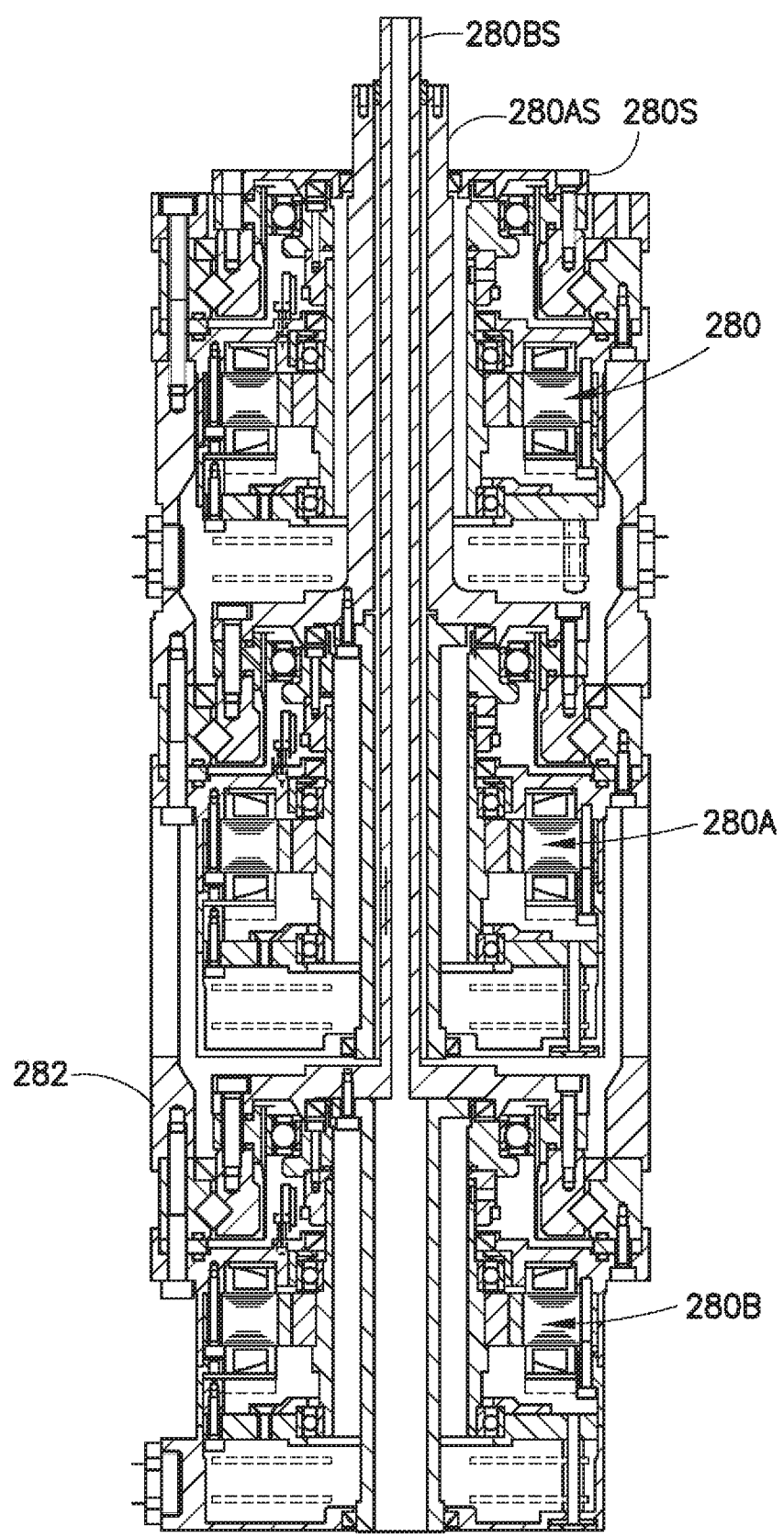
FIG. 2B is a schematic illustration of a portion of the robotic transport drive section of FIG. 2A in accordance with aspects of the disclosed embodiment.

Referring now to FIGS. 2A, 2B, 3A, 3B and 5B in one aspect the transfer unit module 104 includes at least one drive section 200, 200A, 200B (FIGS. 6A and 6B) and at least one transfer arm portion 371 having at least one transfer arm 300, 301. The at least one drive section may include a common drive section 200 that includes a frame 200F that houses one or more of a Z axis drive 270 and a rotational drive section 282. An interior 200FI of the frame 200F may be sealed in any suitable manner as will be described below. In one aspect the Z axis drive may be any suitable drive configured to move the at least one transfer arm 300, 301 along the Z axis. The Z axis drive is illustrated in FIG. 2 as a screw type drive but in other aspects the drive may be any suitable linear drive such as a linear actuator, piezo motor, etc. The rotational drive section 282 may be configured as any suitable drive section such as, for example, a harmonic drive section. For example, the rotational drive section 282 may include any suitable number of coaxially arranged harmonic drive motors 280, such as can be seen in FIG. 2B where the drive section 282 includes three coaxially arranged harmonic drive motors 280, 280A, 280B. In other aspects the drives of drive section 282 may be located side-by-side and/or in a coaxial arrangement. In one aspect the rotational drive section 282 shown in FIG. 2 includes one harmonic drive motor 280 for driving shaft 280S however, in other aspects the drive section may include any suitable number of harmonic drive motors 280, 280A, 280B (FIG. 2B) corresponding to, for example, any suitable number of drive shafts 280S, 280AS, 280BS (FIG. 2B) in the coaxial drive system. The harmonic drive motor 280 may have high capacity output bearings such that the component pieces of a ferrofluidic seal 276, 277, are centered and supported at least in part by the harmonic drive motor 280 with sufficient stability and clearance during desired rotation T and extension R1, R2 movements of the transfer unit module 104. It is noted that the ferrofluidic seal 276, 277 may include several parts that form a substantially concentric coaxial seal as will be described below. In this example the rotational drive section 282 includes a housing 281 that houses one or more drive motor 280 which may be substantially similar to that described above and/or in U.S. Pat. Nos. 6,845,250; 5,899,658; 5,813,823; and 5,720,590, the disclosures of which are incorporated by reference herein in their entireties. The ferrofluidic seal 276, 277 can be toleranced to seal each drive shaft 280S, 280AS, 280BS in the drive shaft assembly. In one aspect a ferrofluidic seal may not be provided. For example, the drive section 282 may include drives having stators that are substantially sealed from the environment in which the transport arms operate while the rotors and drive shafts share the environment in which the arms operate. Suitable examples, of drive sections that do not have ferrofluidic seals and may be employed in the aspects of the disclosed embodiment include the MagnaTran® 7 and MagnaTran® 8 robot drive sections from Brooks Automation, Inc. which may have a sealed can arrangement as will be described below. It is noted that drive shaft(s) 280S, 280AS, 280BS may also have a hollow construction (e.g. has a hole running longitudinally along a center of the drive shaft) to allow for the passage of wires 290 or any other suitable items through the drive assembly for connection to, for example, another drive section (e.g. such as drive section 200A, 200B as will be described below with respect to, e.g. FIGS. 5E, 6A-9C), any suitable position encoders, controllers, and/or the at least one transfer arm 300, 301, mounted to the drive 200. As may be realized, each of the drive motors of drive section 200, 200A, 200B may include any suitable encoders configured to detect a position of the respective motor for determining a position of the end effector 300E, 301E of each transport arm 300, 301.

In one aspect the housing 281 may be mounted to a carriage 270C which is coupled to the Z axis drive 270 such that the Z axis drive 270 moves the carriage (and the housing 281 located thereon) along the Z axis. As may be realized, to seal the controlled atmosphere in which the at least one transfer arm 300, 301 operates from an interior of the drive 200 (which may operate in an atmospheric pressure ATM environment) may include one or more of the ferrofluidic seal 276, 277 described above and a bellows seal 275. The bellows seal 275 may have one end coupled to the carriage 270C and another end coupled to any suitable portion of the frame 200FI so that the interior 200FI of the frame 200F is isolated from the controlled atmosphere in which the at least one transfer arm 300, 301 operates.

Figure 2C:
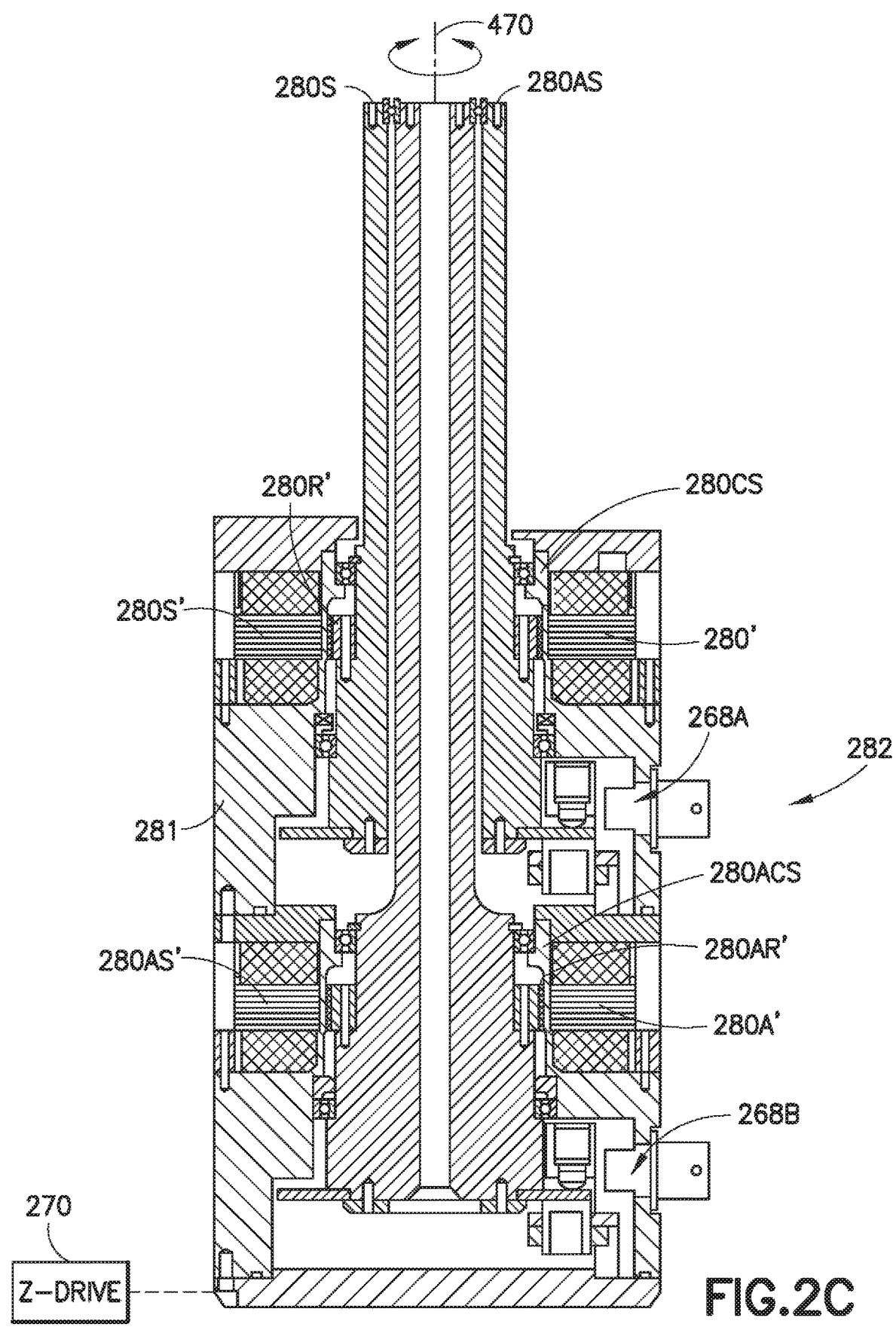
FIG. 2C is a schematic illustration of a portion of the robotic transport drive section of FIG. 2A in accordance with aspects of the disclosed embodiment.
Figure 2D:
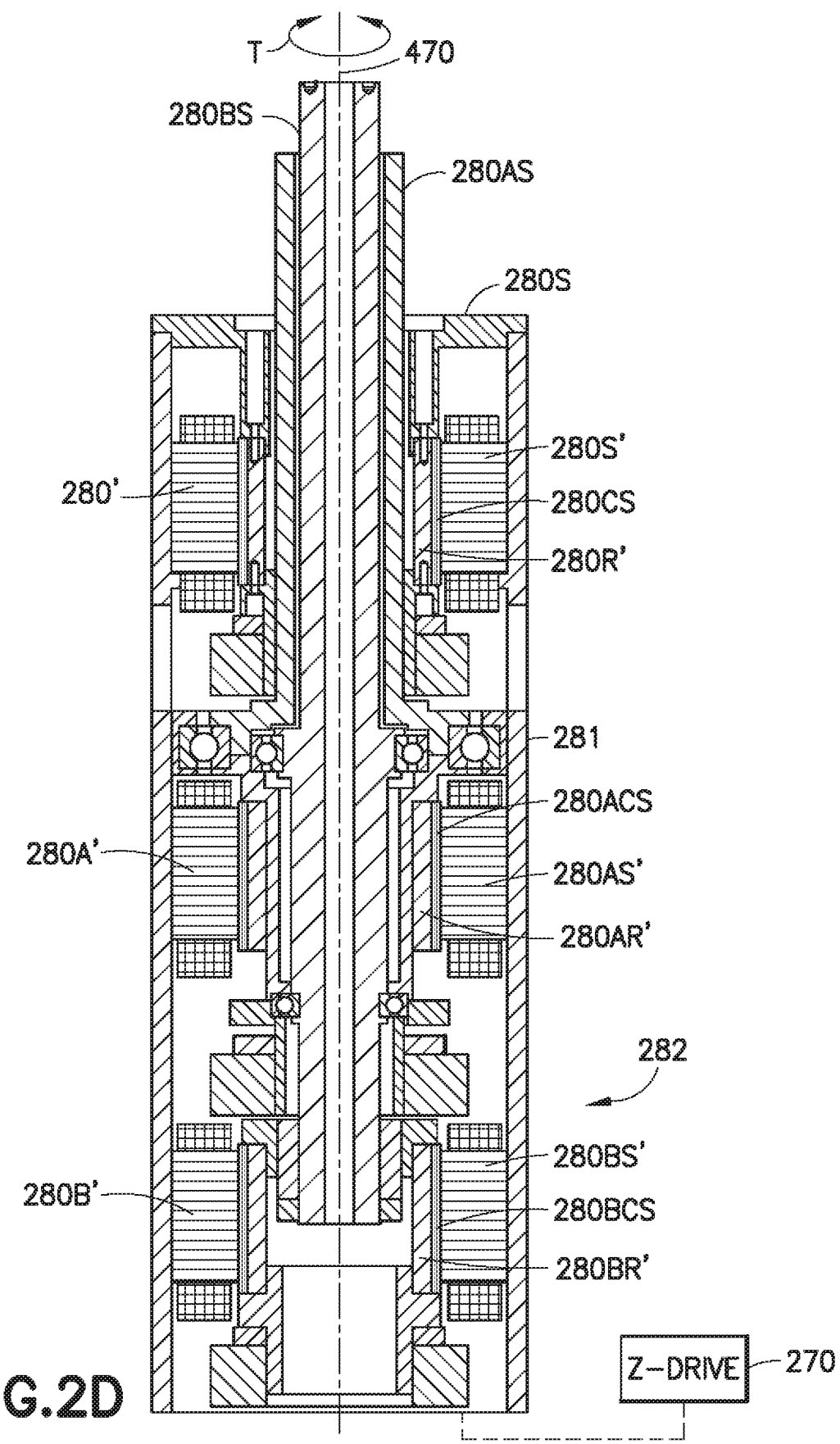
FIG. 2D is a schematic illustration of a portion of the robotic transport drive section of FIG. 2A in accordance with aspects of the disclosed embodiment.

In other aspects, as noted above, a drive having stators that are sealed from the atmosphere in which the transport arms operate without a ferrofluidic seal, such as the MagnaTran® 7 and MagnaTran® 8 robot drive sections from Brooks Automation, Inc., may be provided on the carriage 270C. For example, referring also to FIGS. 2C and 2D the rotational drive section 282 is configured so that the motor stators are sealed from the environment in which the robot arms operate while the motor rotors share the environment in which the robot arms operate. FIG. 2C illustrates a coaxial drive having a first drive motor 280' and a second drive motor 280A'. The first drive motor 280' has a stator 280S' and rotor 280R' where the rotor 280R' is coupled to drive shaft 280S. A can seal 280CS may be positioned between the stator 280S' and rotor 280R' and be connected to the housing 281 in any suitable manner so as to seal the stator 280S' from the environment in which the robot arms operate. Similarly the motor 280A' includes a stator 280AS' and rotor 280AR' where the rotor 280AR' is coupled to drive shaft 280AS. A can seal 280ACS may be disposed between the stator 280AS' and rotor 280AR'. The can seal 280ACS may be connected to the housing 281 in any suitable manner so as to seal the stator 280AS' from the environment in which the robot arms operate. As may be realized any suitable encoder/sensors 268A, 268B may be provided for determining a position of the drive shaft (and the arm(s) which the drive shaft(s) operates). Referring to FIG. 2D a tri-axial rotational drive section 282 is illustrated. The tri-axial rotational drive section may be substantially similar to the coaxial drive section described above with respect to FIG. 2C however, in this aspect there are three motors 280', 280A', 280B', each having a rotor 280R', 280AR', 280BR' coupled to a respective drive shaft 280A, 280AS, 280BS. Each motor also includes a respective stator 280S', 280AS', 280BS' sealed from the atmosphere in which the robot arm(s) operate by a respective can seal 280SC, 280ACS, 280BCS. As may be realized any suitable encoders/sensors may be provided as described above with respect to FIG. 2C for determining a position of the drive shaft (and the arm(s) which the drive shaft(s) operates). As may be realized, in one aspect the drive shafts of the motors illustrated in FIGS. 2C and 2D may not allow for wire 290 feed-through while in other aspects any suitable seals may be provided so that wires may be passed through, for example, hollow drive shafts of the motors illustrated in FIGS. 2C and 2D.

Referring also to FIGS. 4A-4E in this aspect the drive shaft 280S may be coupled to a base member or frame 310F of the transfer arm portion 371 for rotating the transfer arm portion 371 as a unit in the direction of arrow T about a common axis 470 that may be common to each of the at least one transfer arm 300, 301. For example, the base member 310F may be rotated about axis 470 so that the arms 300, 301 are rotated as a unit about the axis 470. The base member 310F may include a mounting portion 450 to which, for example, drive shaft 280S is coupled so that as drive shaft 280S moves the base member 310F moves with it. The mounting portion 450 may include an aperture 450A through which one or more drive shafts, such as drive shafts 280AS, 280BS are coupled to one or more crank members 321. In other aspects the one or more drive shafts 280AS, 280S may be coupled to a respective crank member 321 in any suitable manner, such as through any suitable transmission. In this aspect the drive, 200 may include two drive shafts where one drive shaft 280S is coupled substantially directly to the base member 310F and another drive shaft 280AS is coupled substantially directly to crank member 321.

One or more guide rails, tracks or anti-friction bearings 400, 401 that define a degree of freedom axis and effect extension/retraction of a respective arm 300, 301 may be mounted to the base member 310F in any suitable manner. The bearings 400, 401 may be any suitable bearings such as linear bearings. A first carriage 420 may be moveably mounted or coupled to bearing 400 in any suitable manner. For example the carriage 420 may include a bearing interface portion 420B configured to engage and support the carriage on the bearing 400. The carriage 420 may include an arm mounting portion 420P to which the transport arm 300 is coupled. For example, the transport arm may include a base 300B and an end effector 300E coupled to the base 300B (the end effector may be coupled to the base so that the base is connected to a top or bottom side of the end effector, e.g. the base is located above or below the end effector in a different plane than the end effector, or the base may be connected to the end effector so that the base and end effector are located in a common plane). The base 300B of the transport arm may be coupled to the mounting portion 420P in any suitable manner. In other aspects at least the base 300B of the transport arm 300 and carriage 420 may be integrally formed as a unitary one piece member.

A second carriage 421 may be movably mounted or coupled to bearing 401 in any suitable manner. For example the carriage 421 may include a bearing interface portion 421B configured to engage and support the carriage on the bearing 401. The carriage 421 may include an arm mounting portion 421P to which the transport arm 301 is coupled. For example, the transport arm 301 may include a base 301B and an end effector 301E coupled to the base 301B (the end effector may be fixedly coupled to the base so that the base is connected to a top or bottom side of the end effector, e.g. the base is located above or below the end effector in a different plane than the end effector, or the base may be connected to the end effector so that the base and end effector are located in a common plane). The base 301B of the transport arm may be coupled to the mounting portion 421P in any suitable manner. In other aspects at least the base 301B of the transport arm 301 and carriage 421 may be integrally formed as a unitary one piece member.

Any suitable cover 310C may be provided over the bearings 400, 401 and at least a portion of the first and second carriages 420, 421 to substantially contain any particles generated by the first and second carriage 420, 421. In this aspect the arms 300, 301 are illustrated as being located one above the other in a stacked arrangement but in other aspects the arms may be located side-by-side or have any other suitable arrangement. In one aspect one or more suitable sensors or encoders 123C, 123D may be placed on the frame 310F and be configured to interact with one or more of the carriages 420, 421 or the transfer arms 300, 301 for determining a position of the end effector. In other aspects sensors one or more sensors 123A, 13B may be place in the transfer chamber (FIG. 1B) for detecting the end effector and/or substrate located thereon for determining a position of the end effector and/or substrate thereon.

Each transport arm 300, 301 may be coupled to the crank member 321 (which in one aspect may be common to both arms 300, 301) in any suitable manner. In one aspect the coupling between the crank member 321 and the end effector 300E, 301E of each arm 300, 301 may be substantially rigid while imparting motive forces to drive the end effector 300E, 301E. For example, the crank member 321 may be an elongated member having any suitable length. The crank member 321 may have a proximate end coupled to drive shaft 380S about axis 470. The crank member 321 may also have a distal end opposite the proximate end. The distal end may include one or more pivot joints each having a pivot axis 473, 474. In this aspect the pivot axes 473, 474 are illustrated as being side-by-side but in other aspects the pivot axes may be a common pivot axis or otherwise located axially in-line with each other. In this aspect the distal end of the crank member 321 has a stepped drive link interface where each step 321S1, 321S2 is located any suitable distance from each other to so that drive links 322, 323 may be located in different planes. In other aspects the crank member 321 may not be stepped.

Figure 3C:
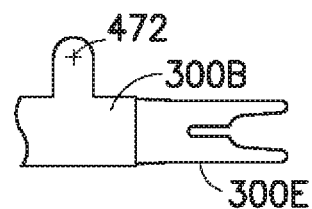
FIG. 3C is a schematic illustration of a portion of the robotic transport of FIGS. 3A-3B in accordance with aspects of the disclosed embodiment.

A drive link 322 may be pivotally coupled to the crank member 321 about pivot axis 474 on step 321S1. The drive link 322 may be an elongated member having any suitable length and any suitable configuration. The drive link 322 may have a proximate end and a distal end where the proximate end may be coupled to the crank member about the pivot axis 474 and the distal end may be coupled to the arm 300 in any suitable manner. In this aspect end effector 300E may have an axis of symmetry SYM (coincident with a longitudinal axis of the end effector) where the end effector 300E is substantially symmetrical about the longitudinal axis. The distal end of the drive link 322 may be pivotally coupled to the base 300B of arm 300 about a pivot joint having a pivot axis 472 that is positioned along the axis of symmetry SYM of end effector 300E. In other aspects, the pivot joint having pivot axis 472 may be positioned off of the axis of symmetry SYM in any suitable manner such, as for example, shown in FIG. 3C. In FIG. 3C the base 300B includes a protrusion to which the drive link 322 is pivotally coupled at pivot axis 472.

A drive link 323 may be pivotally coupled to the crank member 321 about pivot axis 473 on step 321S2. As noted above, the distance between the steps 321S1, 321S2 may place the drive links on different planes and allow the drive links 322, 323 to pass one over the other. The drive link 323 may be substantially similar to drive member 322. For example, the drive link 323 may be an elongated member having any suitable length and any suitable configuration. The drive link 323 may have a proximate end and a distal end where the proximate end may be coupled to the crank member about the pivot axis 473 and the distal end may be coupled to the arm 301 in any suitable manner. In this aspect end effector 301E may have an axis of symmetry SYM (coincident with a longitudinal axis of the end effector) where the end effector 301E is substantially symmetrical about the longitudinal axis. The distal end of the drive link 323 may be pivotally coupled to the base 301B of arm 301 about a pivot joint having a pivot axis 471 that is positioned along the axis of symmetry SYM of end effector 301E. In other aspects, the pivot joint having pivot axis 471 may be positioned off of the axis of symmetry SYM in any suitable manner such, as for example, on a protrusion of the base member 301B in a manner substantially similar to that described above with respect to FIG. 3C.

Figure 4A:
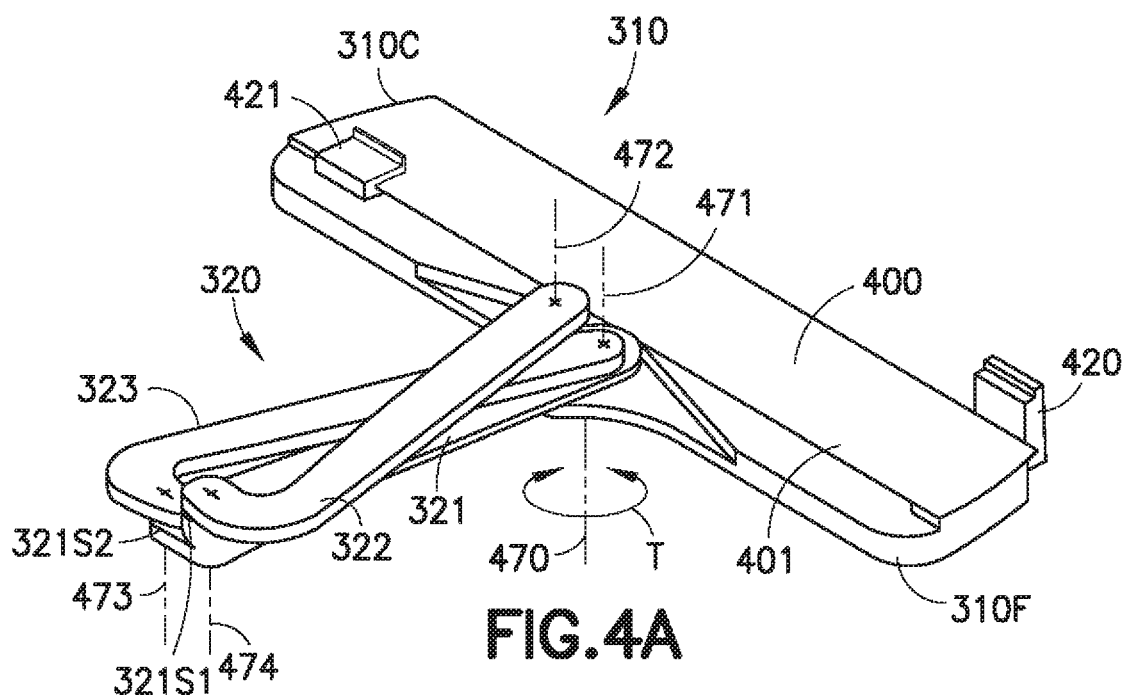
FIGS. 4A-4E are schematic illustrations of portions of the robotic transport of FIGS. 3A-3B in accordance with aspects of the disclosed embodiment.
Figure 4B:
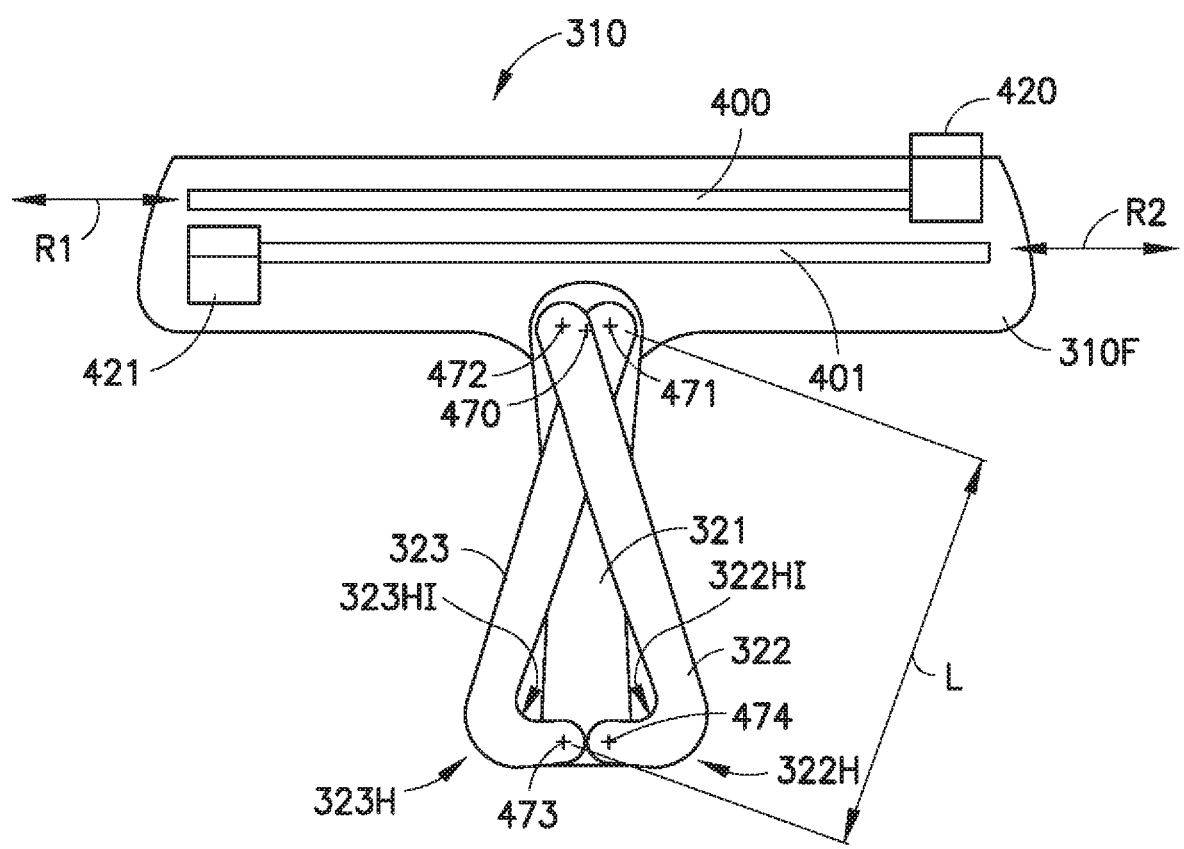
Figure 4C:
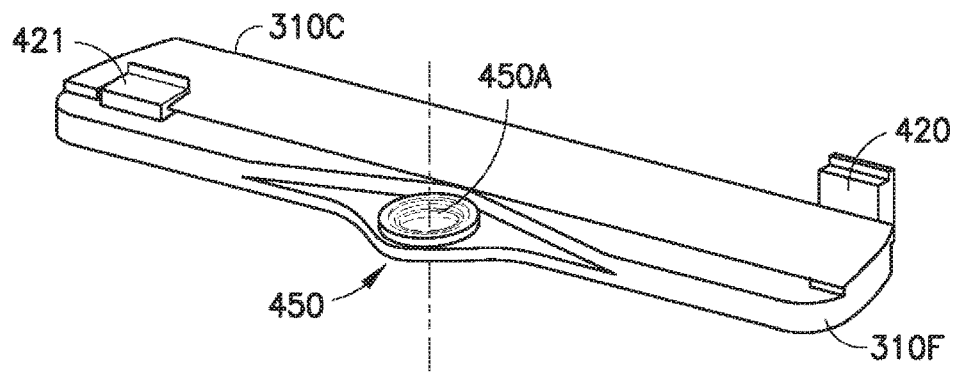
Figure 4D:
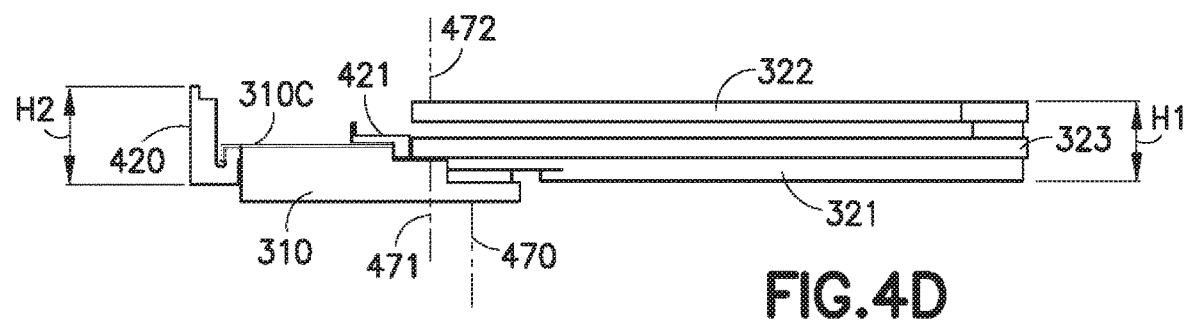
Figure 4E:
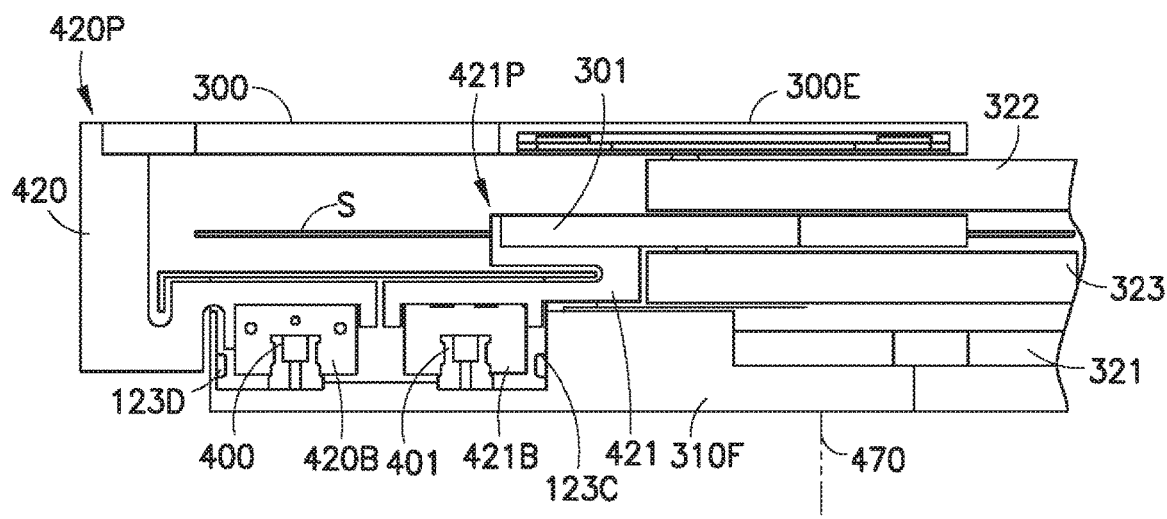

As can be seen in FIGS. 4D and 4E a stack height H1 of the crank member 321 and drive links 322, 323 may be shared with a height H2 of the bearings 400, 401 and carriages 420, 421. For example, the stack height H1 may be substantially equal to or less than the height H2 of the bearings and carriages. In other aspects the stack height of the crank member 321 and drive links 322, 323 may be any suitable stack height relative to the bearings 401, 402 and carriages 420, 421.

The crank member 321 and one or more of the drive links 322, 323 may define a transmission link or linkage 320. In one aspect one or more of the transmission linkage 320 and respective carriage 420, 421/guide member 400, 401 may be configured to support the respective arms 300, 301. In other aspects the transmission linkage 320 may independently support one or more of the arms 300, 301. In still other aspects the respective carriage 420, 421/guide member 400, 401 may be configured to independently support a respective arm 300, 301. The transmission linkage 320 may be a bi-axially rigid link where the term bi-axially rigid link means that it is configured to transmit driving force along an axis in two directions. For example, as the crank member rotates in the direction of arrow 398A torque applied to the crank member 321 by the drive 200 is transmitted to the arm 301 by drive link 323 so that the arm 301 is pushed to linearly extend along axis of extension/retraction R2. As the crank member 321 is rotated in the direction of arrow 398B torque applied to the crank member 321 is transferred to the arm 301 through drive link 323 so that the arm 301 is pulled to linearly retract along axis of extension/retraction R2. Similarly, as the crank member rotates in the direction of arrow 398B torque applied to the crank member 321 by the drive 200 is transmitted to the arm 300 by drive link 322 so that the arm 300 is pushed to linearly extend along axis of extension/retraction R1. As the crank member 321 is rotated in the direction of arrow 398A torque applied to the crank member 321 is transferred to the arm 300 through drive link 322 so that the arm 300 is pulled to linearly retract along axis of extension/retraction R1. The common crank member 321 and the drive links 322, 323 (e.g. the transmission link 320) may be configured such that as one arm 300, 301 extends along a respective axis R1, R2 the other one of the arms 300, 301 (e.g. the trailing arm) remains substantially stationary or static along the axis R1, R2 or moves minimally at the end of crank member 321 stroke along the axis R1, R2 (e.g. there is substantially no residual motion of the static arm/end effector which may allow for increased extension/retraction speeds of the end effectors). In one aspect the transmission linkage 320 may form a lost motion linkage. In other aspects, any suitable linkage may couple the drive 200 to the arms 300, 301. For example, suitable linkages are described in U.S. Pat. No. 7,946,800 entitled "Substrate Transport Apparatus with Multiple Independently Movable Articulated Arms" issued on May 24, 2011 and U.S. patent application No. 12/117,415 entitled "Substrate Transport Apparatus with Multiple Movable Arms Utilizing a Mechanical Switch Mechanism" filed on May 8, 2008 and Ser. No. 13/113,476 entitled "Substrate Transport Apparatus with Multiple Independently Movable Articulated Arms" filed on May 23, 2011 the disclosures of which are incorporated herein by reference in their entireties.

Figure 3B:
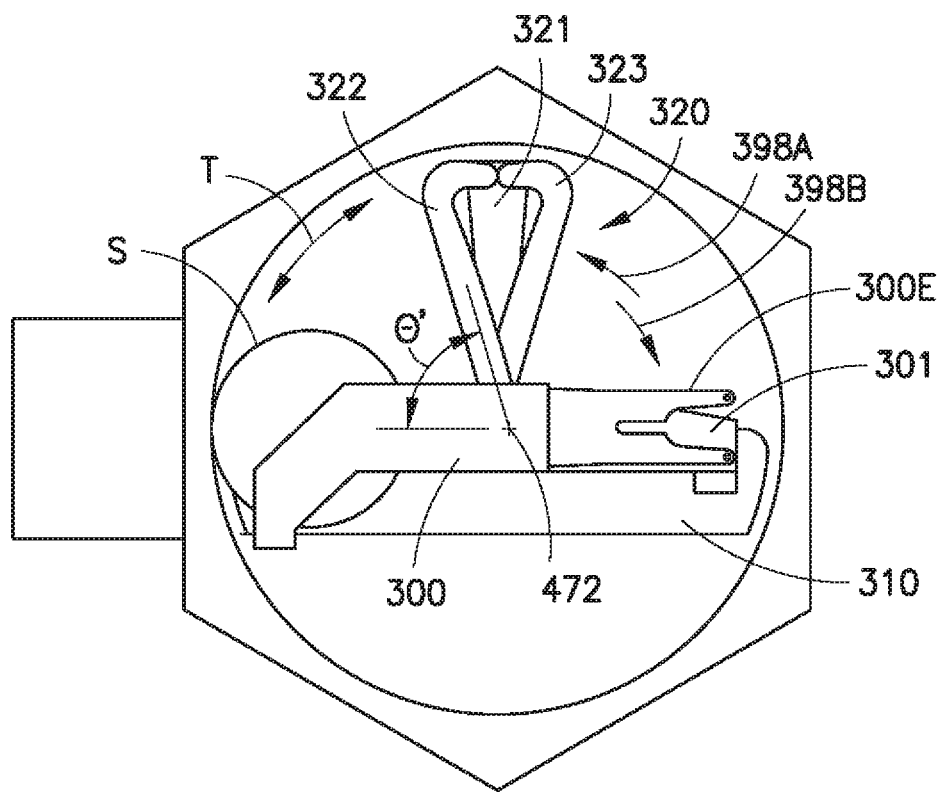

Each drive link 322, 323 and/or the crank member 321 may be configured such that the drive link 322, 323 is arranged at any suitable predetermined angle $\theta'$ relative to the axis of extension/retraction R1, R2 when the arms are in a retracted position as shown in FIG. 3B, where the retracted position may be a position of the arms 300, 301 resulting from when the drive motor driving the crank member 321 is at a home position. In one aspect the distal end of each drive link may include a substantially rigid elbow portion 322H, 323H that extends away from a respective end effector 300E, 301E (see FIG. 3A where elbow portion of drive link 322 driving arm 300 extends away from end effector 300E and elbow portion of drive link 323 driving arm 301 extends away from end effector 310E). The elbow portions 322H, 323H may offset a portion of a respective drive link 322, 323 from the respective pivot axis 473, 474 to decrease the angle $\theta'$ when compared to a substantially straight drive link. In one aspect The angle $\theta'$ may be a predetermined angle that provides a mechanical advantage to the crank member 321 when the crank member 321 is substantially perpendicular to the axis of extension/retraction R1, R2 (e.g. in the home position) to allow the transmission linkage 320 to push the arm 300, 301 for extension (e.g. a predetermined kinematic angle is maintained to extend/retract the arms). The elbow portion 322H, 323H may also be configured so that an angle $\theta''$ between the drive link 322, 323 and a respective axis of extension/retraction when the arm 300, 301 is fully extended for picking/placing substrates S (see FIG. 3A) provides for substantially no or substantially minimal movement of the trailing arm 300, 301 (e.g. there is substantially no residual motion of the static arm/end effector) which may allow for increased extension/retraction speeds of the end effectors.

The substantially rigid elbow portion 322H, 323H and/or the crank member 231 may be configured to, for example, allow the drive links to cross over one another with no penalty in reach (e.g. extension distance) of the arms 300, 301 while providing for a reduced combined arm length when the arms are fully retracted. For example, the substantially rigid elbow portion 322H, 323H of each drive link 322, 323 may have an interior 322HI, 323HI that includes the pivot axis 473, 474 of the other drive link 322, 323, see e.g. FIG. 3A where the pivot axis 474 of link 322 is included in the interior of elbow portion 323HI of drive link 323 when the arm 301 is extended. Similarly, the pivot axis 473 of link 323 is included in the interior of elbow portion 322HI of drive link 322 when the arm 300 is extended.

As may be realized, the transmission linkage 320 is coupled substantially directly to a drive shaft of drive 200 without bands and/or belts to increase the stiffness of the transmission linkage 320 when compared to band/belt driven arms. As may also be realized, the shallow rake or angle θ" of the drive links 322, 323 and/or interconnected/nested configuration of the transmission linkage 320 relative to the drive 200 and arms 300, 301 may provide a mechanical advantage when one arm is extended to stiffen the transmission linkage 320 and/or the arms 300, 301 so that the transmission linkage 320 may have a stiffness that defines sub-25 micron definition of end effector 300E, 301E movement.

Figure 5A:
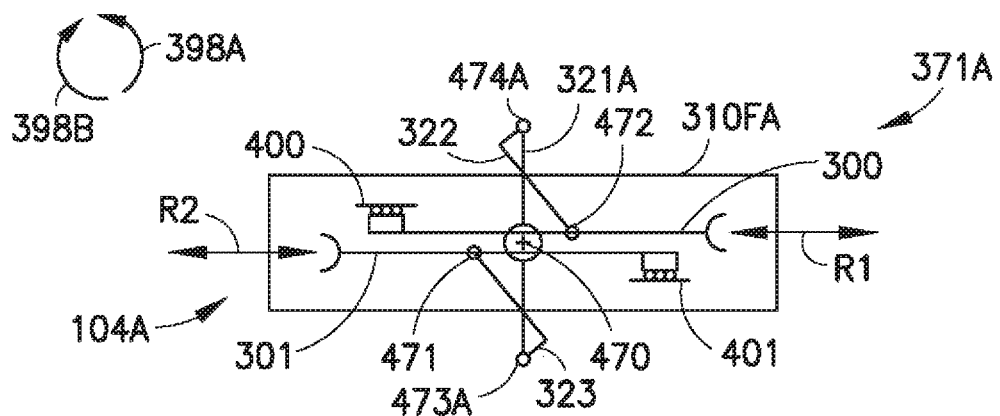
FIGS. 5A-5F are schematic illustrations of robotic transports in accordance with aspects of the disclosed embodiment.
Figure 5B:
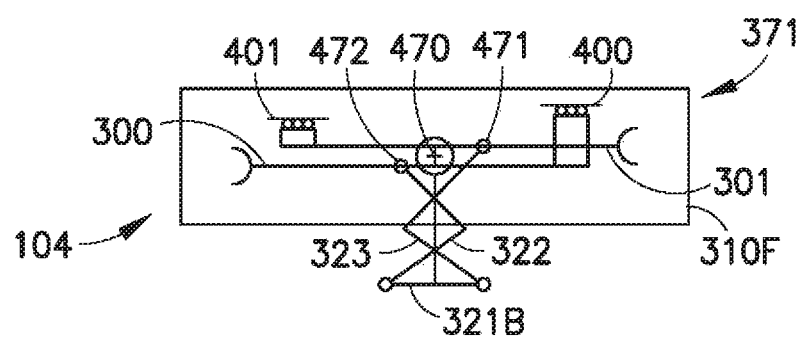

While the transfer unit module 104 is described above as having two transfer arms 300, 301 on a single base member 310 in other aspects a single transfer arm may be located on a single base member 310. In still other aspects, one or more base members 310 may be stacked one above the other such that each base member 310 includes at least one transfer arm 300, 301. The stacked base members 310 and the respective transfer arms may be driven by a common drive section or the drive motors for driving the at least one transfer arm 300, 301 of a respective base member 310 may be distributed within the transfer unit module. While the arms 300, 301 of transfer unit module 104 are illustrated in FIGS. 3A-4C as opposing arms (e.g. the arms extend in opposing directions) in other aspects the arms and the transmission linkage my have any suitable arrangement/configuration relative to one another. For example, FIG. 5A illustrates a transfer unit module 104A in accordance with aspects of the disclosed embodiment. The transfer unit module 104A may be substantially similar to the transfer unit modules described herein. In this aspect the base member 310FA is coupled to one drive shaft 280S of the drive 200 (FIGS. 2A and 2B) while a common crank member 321A is coupled to another drive shaft 280AS of the drive 200. Here the crank member extends on opposite sides of the common axis 470 so as to have a proximate central portion (which may be coupled to the drive 200 in any suitable manner) and opposing distal ends. Drive link 322 may be pivotally coupled to a distal end at pivot axis 474A for coupling the arm 300 to the crank member 321A in a manner substantially similar to that described above. Drive link 323 may be pivotally coupled to the opposing distal end at pivot axis 473A to couple the crank member 321A to the arm 301 in a manner substantially similar to that described above. In this aspect an independent degree of freedom along the axis of extension/retraction R for each arm and rotation of the arms as a unit in the direction of arrow T about common axis 470 is achieved with a two drive axis drive section. The transfer unit module 104A may operate in a manner substantially similar to that described above such that as crank member 321A rotates in the direction of arrow 398A drive link 322 pushes arm 300 to extend along axis R1 while arm 301 remains substantially stationary and/or is retracted from an extended position. As crank member 321A rotates in the direction of arrow 398B drive link 323 pushes arm 301 to extend along axis R1 while arm 301 remains substantially stationary and/or is retracted from an extended position. Here the extension and retraction of arms 300, 301 is coupled but in other aspects the extension and retraction of the arms 300, 301 may be uncoupled by providing separate and distinct independently driven crank member for each arm 300, 301 as described herein.

Figure 5C:
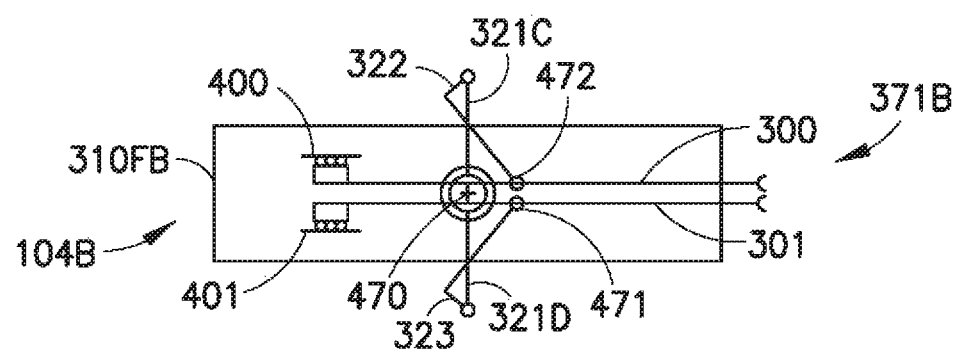

FIG. 5C illustrates a transfer unit module 104B in accordance with an aspect of the disclosed embodiment. The transfer unit module 104B may be substantially similar to those described herein. In this aspect the base member 310FB is coupled to a drive shaft 280S of the drive 200 in a manner substantially similar to that described above. A first crank member 321C may be coupled to a second drive shaft 280AS of the drive 200 while a second crank member 321D is coupled to a third drive shaft 280BS of the drive 200. Here the crank members may extend from the axis 470 towards opposite lateral (e.g. substantially transverse to the axis of extension/retraction) sides of the base member 301FB when the arms 300, 301 are in a fully retracted position. In this aspect the extension/retraction of arm 300 is uncoupled from the extension/retraction of arm 301 so that each arm independently extends in the same direction (compared to the opposing extension directions illustrated with respect to transfer unit modules 104, 104A). As may be realized, extension of the arms 300, 301 in the same direction may allow for a fast swapping of substrate from a substrate holding station, such as processing stations 130. In other aspects the arms 300, 301 may extend in opposing directions. In this example, each arm 300, 301 is independently operable so that both arms may extend at the same time or at different times. For example, drive link 322 may couple crank member 321C to arm 300 so that as the second drive shaft 280AS rotates, arm 300 is driven to extend or retract by the crank member 321C and drive link 322 in a manner substantially similar to that described above. Similarly, drive link 323 may couple crank member 321D to arm 301 so that as the third drive shaft 280BS rotates, arm 301 is driven to extend or retract by the crank member 321D and drive link 323 in a manner substantially similar to that described above. In other aspects a common crank member may drive the drive links 322, 323 in a manner similar to that described herein. In this aspect an independent degree of freedom for each arm along the axis of extension/retraction R and rotation of the arms as a unit in the direction of arrow T about common axis 470 is achieved with a three drive axis drive section.

Figure 5D:
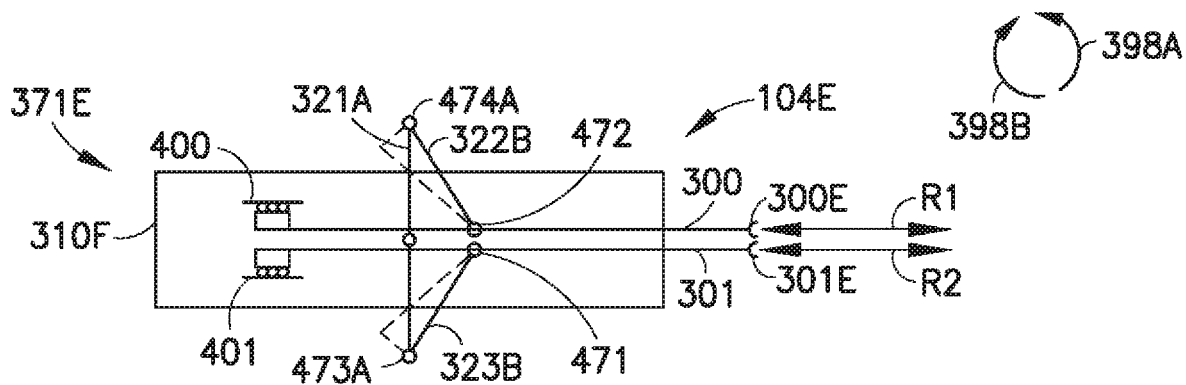

FIG. 5D illustrates a transfer unit module 104E in accordance with an aspect of the disclosed embodiment. The transfer unit module 104E may be substantially similar to those described herein. In this aspect the arms 300, 301 are arranged to extend in the same direction as described with respect to FIG. 5C. In other aspects the arms 300, 301 may extend in opposing directions. In this aspect the extension and retraction of the arms 300, 301 is coupled in a manner substantially similar to that described above with respect to FIG. 5A so that an independent degree of freedom along the axis of extension/retraction R for each arm and rotation of the arms as a unit in the direction of arrow T about common axis 470 is achieved with a two drive axis drive section. For example, a drive link 322B may be pivotally coupled at pivot axis 474A to a distal end of the common crank member 321 for coupling the arm 300 to the crank member 321A in a manner substantially similar to that described above. A drive link 323B may be pivotally coupled to the opposite distal end of the common crank member 321A for coupling the arm 301 to the crank member 321A in a manner substantially similar to that described above. In other aspects each drive link may be coupled to an independently rotatable crank member for uncoupled operation of each arm 300, 301 in a manner substantially similar to that described herein so that an independent degree of freedom for each arm along the axis of extension/retraction R and rotation of the arms as a unit in the direction of arrow T about common axis 470 is achieved with a three drive axis drive section. In this aspect the drive links 322B, 323B may be substantially straight rigid links that extend from the crank member 321A to the respective arm 300, 301 in a direction that is generally towards the respective end effector 300E, 301E. The transfer unit module 104E may operate in a manner substantially similar to that described above such that as crank member 321A rotates in the direction of arrow 398A drive link 323B pushes arm 301 to extend along axis R2 while arm 300 remains substantially stationary and/or is retracted from an extended position. As crank member 321A rotates in the direction of arrow 398B drive link 322B pushes arm 300 to extend along axis R1 while arm 301 remains substantially stationary and/or is retracted from an extended position.

Figure 5E:
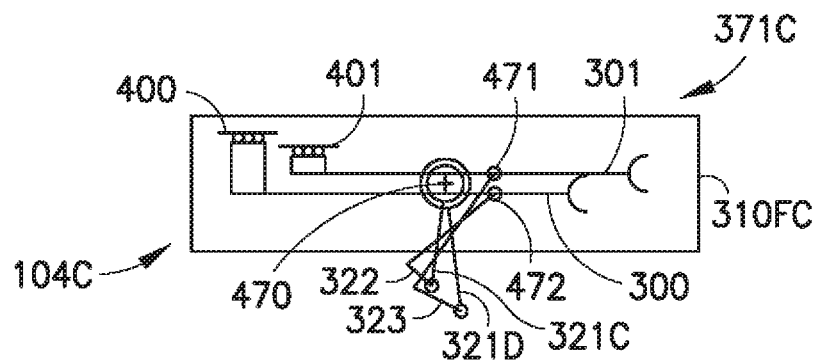

FIG. 5E illustrates a transfer unit module 104C in accordance with an aspect of the disclosed embodiment. The transfer unit module 104C may be substantially similar to those described herein. In this aspect the base member 310FC is coupled to a drive shaft 280S of the drive 200 in a manner substantially similar to that described above. A first crank member 321C may be coupled to a second drive shaft 280AS of the drive 200 while a second crank member 321D is coupled to a third drive shaft 280BS of the drive 200. Here the crank members may extend from the axis 470 towards a common lateral (e.g. substantially transverse to the axis of extension/retraction) side of the base member 301FC when the arms 300, 301 are in a fully retracted position. In this aspect the extension/retraction of arm 300 is uncoupled from the extension/retraction of arm 301 so that each arm independently extends in the same direction (compared to the opposing extension directions illustrated with respect to transfer unit modules 104, 104A). In other aspects the arms 300, 301 may extend in opposing directions. In this aspect an independent degree of freedom for each arm along the axis of extension/retraction R and rotation of the arms as a unit in the direction of arrow T about common axis 470 is achieved with a three drive axis drive section. In this example, each arm 300, 301 is independently operable so that both arms may extend at the same time or at different times. For example, drive link 322 may couple crank member 321C to arm 300 so that as the second drive shaft 280AS rotates, arm 300 is driven to extend or retract by the crank member 321C and drive link 322 in a manner substantially similar to that described above. Similarly, drive link 323 may couple crank member 321D to arm 301 so that as the third drive shaft 280BS rotates, arm 301 is driven to extend or retract by the crank member 321D and drive link 323 in a manner substantially similar to that described above.

Figure 5F:
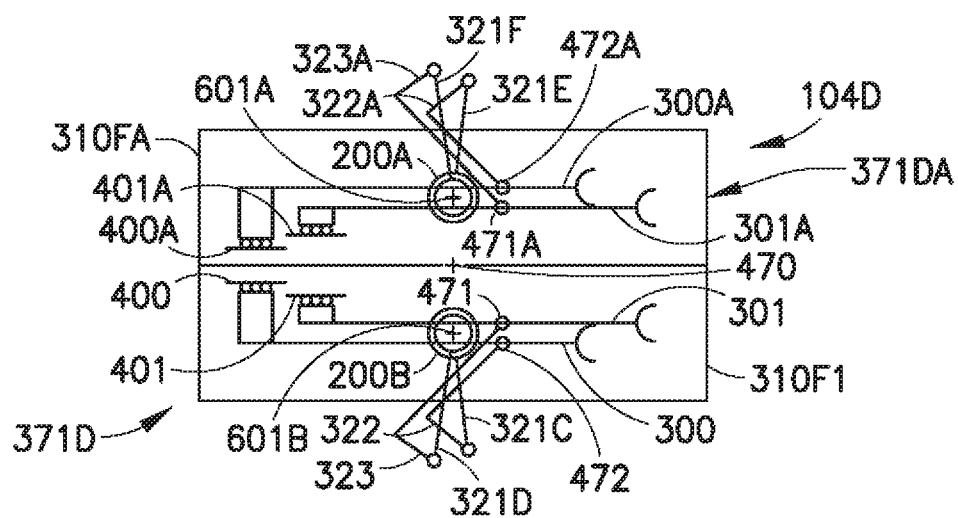
Figure 6A:
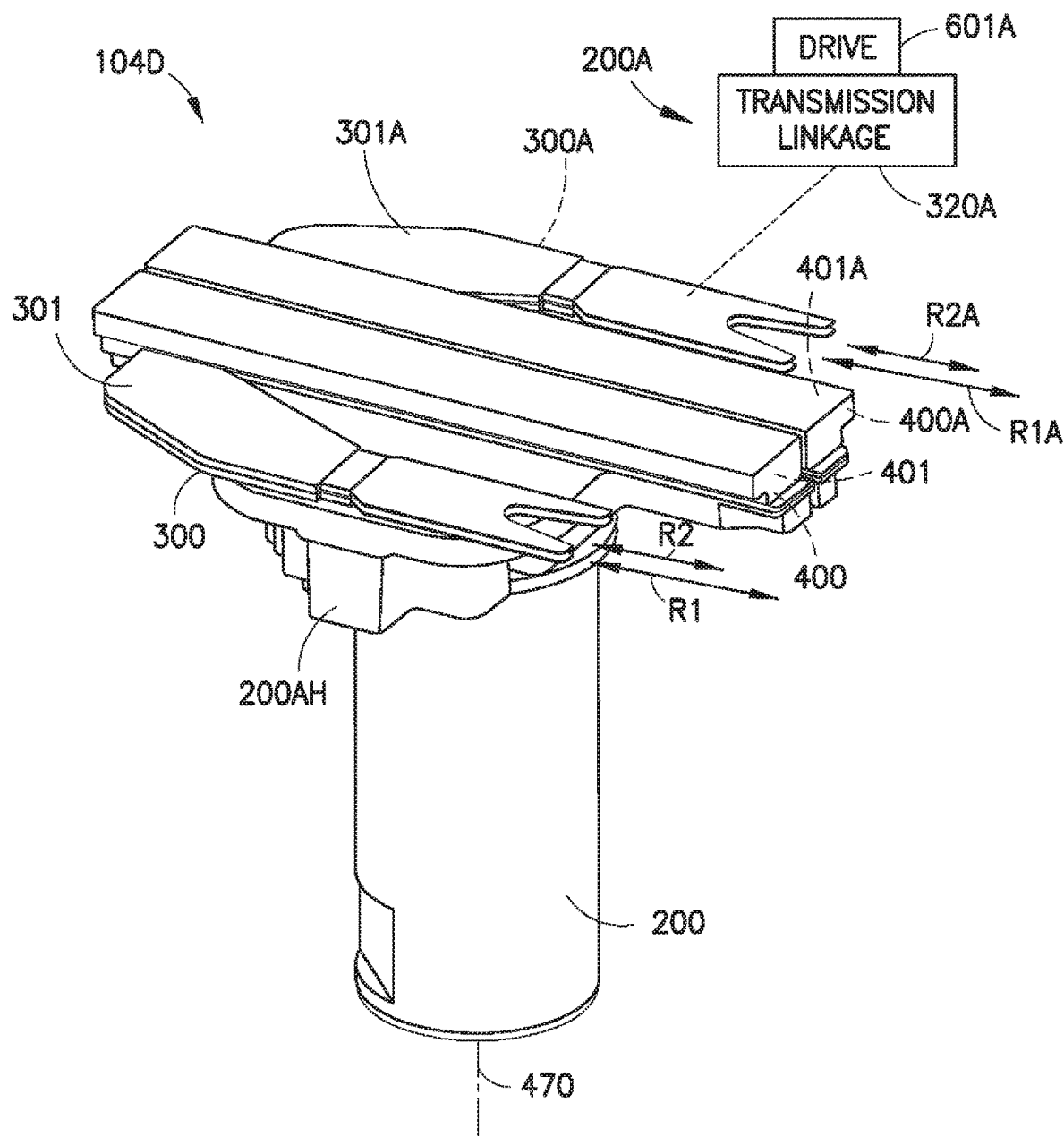
FIGS. 6A-6C are schematic illustrations of a robotic transport in accordance with aspects of the disclosed embodiment.
Figure 6B:
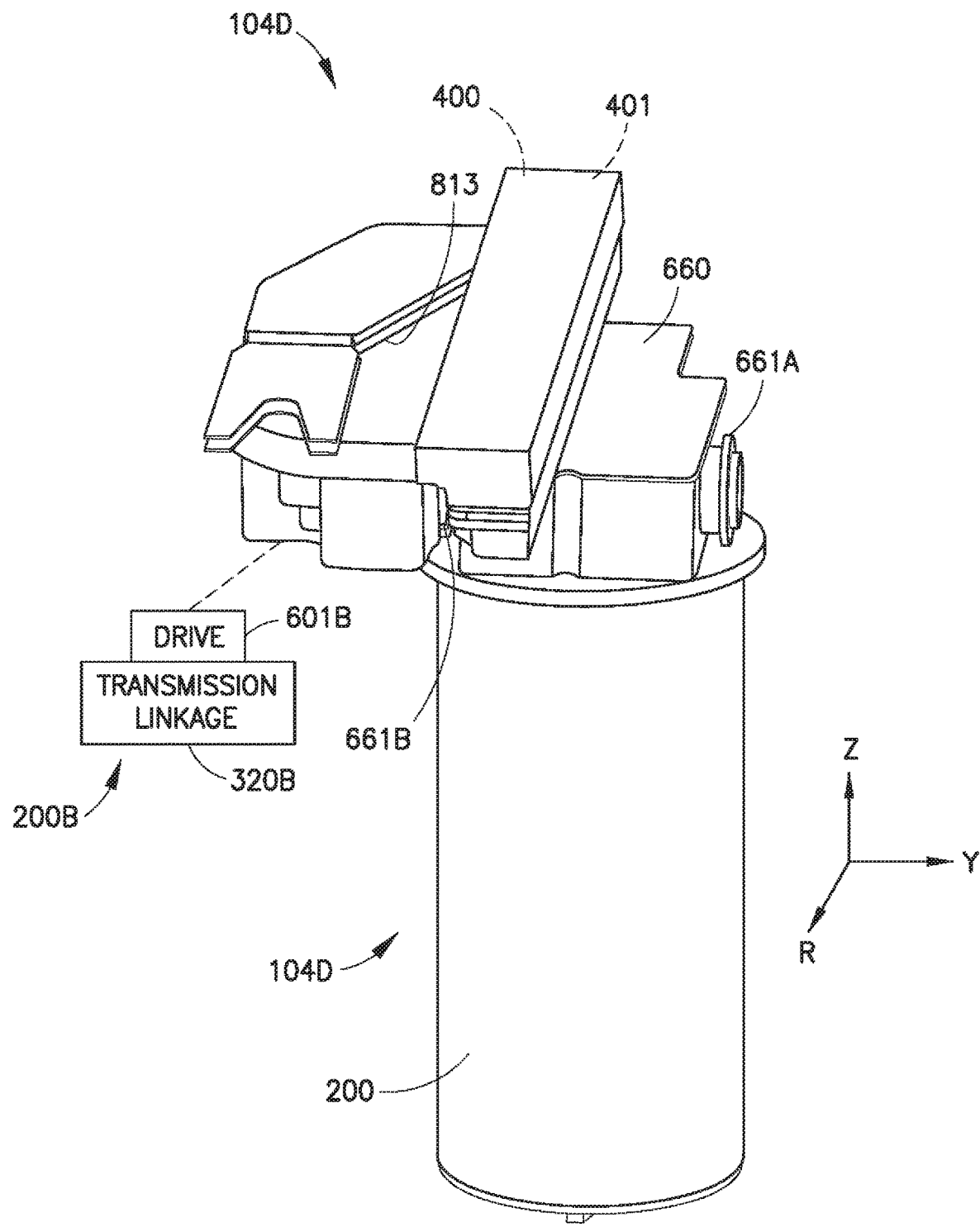

Referring now to FIGS. 5F, 6A and 6B a transfer unit module 104D is illustrated in accordance with aspects of the disclosed embodiment. The transfer unit module 104D may be substantially similar to those described herein. In this aspect the transfer unit module 104D is configured to picking/placing substrates substantially simultaneously or at different times into side by side substrate holding stations, such as illustrated in FIGS. 1B-1D. In this aspect at least a 5 axis drive system may be provided so that each arm 300, 301, 300A, 301A has an independent degree of freedom along a respective axis of extension/retraction R and for rotation of the arms as a unit about common axis 470. In other aspects additional drive axes may be provide such as to provide each base member 310F1, 310F2 with an independent Z-axis movement, providing each base member 310F1, 310F2 with a common Z-axis movement, pivoting of one or more base members 310F1, 310F2 and movement of one or more base members 310F1, 310F2 in the direction Y as described herein. The base member may include a drive interface portion 660 (FIG. 6B) and one or more transfer arm portions 310F1, 310F2 mounted side-by-side (or in any other suitable arrangement) to the drive interface portion 660. Each transfer arm portion 310F1, 310F2 may be substantially similar to one or more of transfer arm portions 371, 371A, 371B, 371C, 371E (FIGS. 5A-5E) described above. As may be realized, as the drive interface portion 660 is rotated about common axis 470 the transfer arm portions 371D, 371Da rotate with it as a unit. In this aspect the transfer arm portions 310F1, 310F2 are illustrated as being substantially similar to transfer arm portion 371C for exemplary purposes. Here the drive interface portion 660 may be mounted to a shaft, such as shaft 280S, of the drive 200 in a manner substantially similar to that described above. The transfer arm portions 310F1, 310F2 may be mounted to the drive interface portion 660 in any suitable manner. In one aspect the transfer arm portions 310F1, 310F2 may be stationarily mounted to the drive interface portion 660 in any suitable manner such that a distance and angle between the axes of extension and retraction R1, R2, R1A, R2A of the transfer arm portions 310F1, 310F2 are fixed. In other aspects, as will be described below, one or more of the distance and angle between the axes of extension and retraction of the transfer arm portions 310F1, 310F2 may be adjustable to allow, for example, automatic workpiece/substrate centering using any suitable sensors, such as sensors 123A, 123B located to detect a substrate S in a transfer chamber in a manner substantially similar to that described in, for example, U.S. patent application Ser. No. 13/617,333 entitled "Wafer Center Finding with Kalman Filter" filed on Sep. 14, 2012 and U.S. Pat. No. 7,925,378 entitled "Process Apparatus with On-The-Fly Workpiece Centering" issued on Apr. 12, 2011; U.S. Pat. No. 7,859,685 entitled "Wafer Center Finding with Charge-Coupled Devices" issued on Dec. 28, 2010; Ser. No. 8,270,702 entitled "Wafer Center Finding with a Kalman Filter" issued on Sep. 18, 2012; U.S. Pat. No. 7,792,350 entitled "Wafer Center Finding" issued on Sep. 7, 2010; U.S. Pat. No. 7,894,657 entitled "Wafer Center Finding" issued Feb. 22, 2011; U.S. Pat. No. 8,125,652 entitled "Wafer Center Finding with Charge-Coupled Devices" issued Feb. 28, 2012; and U.S. Pat. No. 8,253,945 entitled "Wafer Center Finding with Charge-Coupled Devices" issued Aug. 28, 2012 the disclosures of which are incorporated herein by reference in their entireties.

Figure 6C:
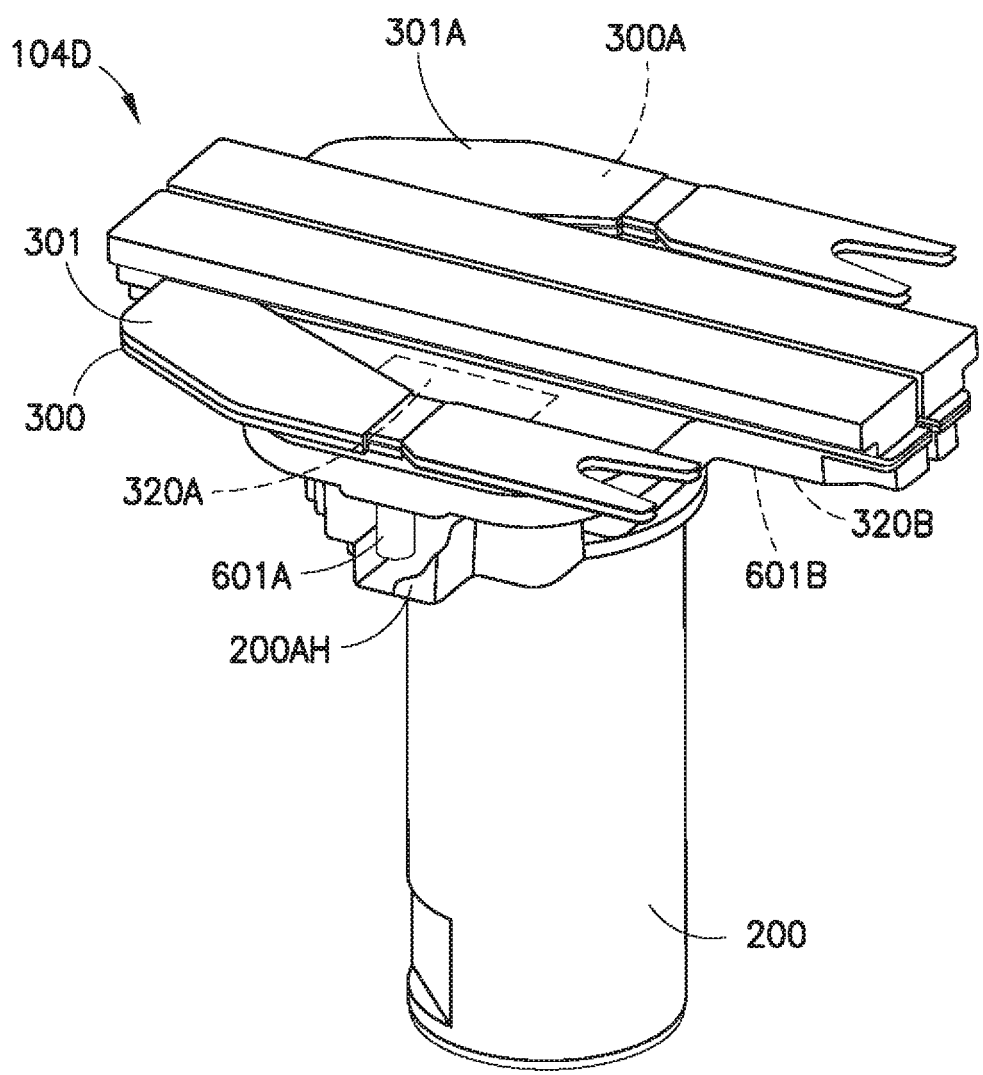

Referring also to FIG. 6C, in this example, each transfer arm portion 371D, 371DA includes a base member 310F1, 310F2 and a drive 200A, 200H mounted to each base member 310F1, 310F2. The drive 200A, 200B may include one or more drive motors 601A, 601B that are at least partially mounted in any suitable manner within each drive housing 200AH, 200BH. The drive housing 200AH, 200BH forms a sealed chamber which when mounted to the drive interface portion 660 (which also forms a sealed chamber) is in sealed atmospheric communication with an interior of the drive 200 so that the motors of the drives 200, 200A, 200B are located within an atmospheric environment that is isolated or sealed from an environment in which the arms 300, 301, 300A, 301A operate. Each drive 200A, 200B may include one or more suitable drive motors 601A, 601B and one or more transmission linkage 320A, 320B substantially similar to those motors and transmission linkage described above. In this aspect each drive motor 601A, 601B may be a rotary drive motor that includes two drive shafts where one drive shaft rotates a respective one of crank member 321C, 321E and another drive shaft rotates a respective one of crank member 321D, 321F for operating each transfer arm portion in a manner substantially similar to that described above. Here the axis of rotation of the crank members 321C, 321D (which may be coincident with an axis of ration of drive 601B) and the axis of rotation of crank members 321E, 321F (which may be coincident with an axis of ration of drive 601A) are offset from the common axis of rotation 470. As may be realized, any suitable encoders/position sensors may be located on the drive shafts of the drive motors 601A, 601B. In another aspect any suitable encoders/positions sensors may be disposed adjacent tracks 400, 401, 400A, 401A for detecting a position of a respective carriage 420, 421 (see e.g. FIGS. 4A-4E). The encoders/positions sensors located adjacent the tracks 400, 401, 400A, 401A may be enclosed or otherwise sealed in any suitable manner in any suitable enclosure, such as a thin walled enclosure, for isolating the encoders/positions sensors from the environment in which the robot arm operate. Examples of sensors operating through a separation wall or enclosure wall can be found in, for example, U.S. provisional patent application Nos. 61/903,726 entitled "Position Feedback for Sealed Environments" filed on Nov. 13, 2013 and 61/903,813 entitled "Sealed Robot Drive" filed on Nov. 13, 2013 the disclosures of which are incorporated by reference herein in their entireties.

As noted above, one or more of the transfer arm portions 371D, 371DA may be movably mounted to the drive interface portion 660. For example, referring to FIGS. 6B, in one aspect one or more of the transfer arm portions 371D, 371DA may be mounted to a respective movable sealing member 661A, 661B in any suitable manner. In one aspect the respective movable sealing member 661A, 661B may be mounted to housing 200AH, 200BH of the transfer arm portions 371D, 371DA. The movable sealing member 661A, 661B is mounted to the drive interface portion 660 in any suitable manner so as to move linearly in the direction Y. The movable sealing member 661 may be configured to support a respective transfer arm portion 371D, 371D1 for movement in a direction Y transverse to the direction of extension/retraction R. The movable sealing member 661A, 661B may be configured to allow movement of the transfer arm portions 371D, 371DA relative to the drive interface portion 660 while maintaining a sealed atmosphere within the drive housing 200AH, 200BH and the drive interface portion 660. One or more suitable linear drives 710 may be disposed within the drive interface portion 660 for driving a respective movable sealing member 661A, 661B in the direction Y for changing one or more of a distance D between axes of extension/retraction R1, R2 of transfer arm portion 371D and axes of extension/retraction R1A, R2A of transfer arm portion 371DA and a distance D1, D2 between the common axis 470 and respective axes of extension/retraction R1, R2, R1A, R2A of transfer arm portions 371D, 371DA. In one aspect, as shown in FIG. 6B, both transfer arm portions 371D, 371DA may move in the direction Y while in other aspects, as shown in FIGS. 7A and 7B only one transfer arm portion 371DA (or 371D) may be movable in the direction Y while the other transfer arm portion 371D (or 371DA) is mounted to the drive interface portion 660 by a fixed support member 700 so as to be stationary in the direction Y relative to the drive interface portion 660.

Figure 8A:
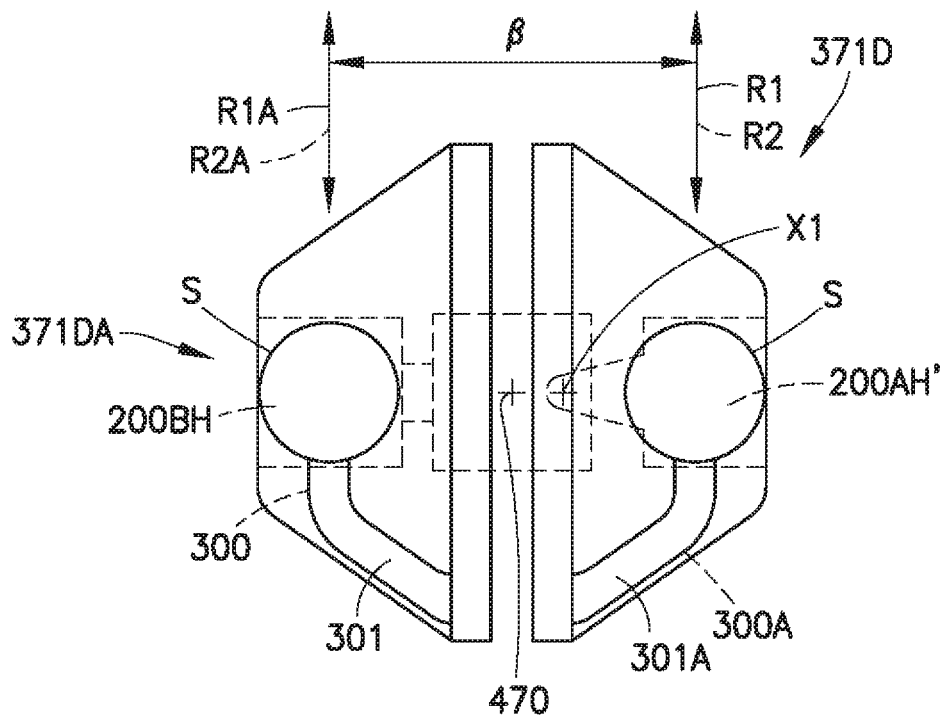
FIGS. 8A-8D are schematic illustrations of a robotic transport in accordance with aspects of the disclosed embodiment.
Figure 8B:
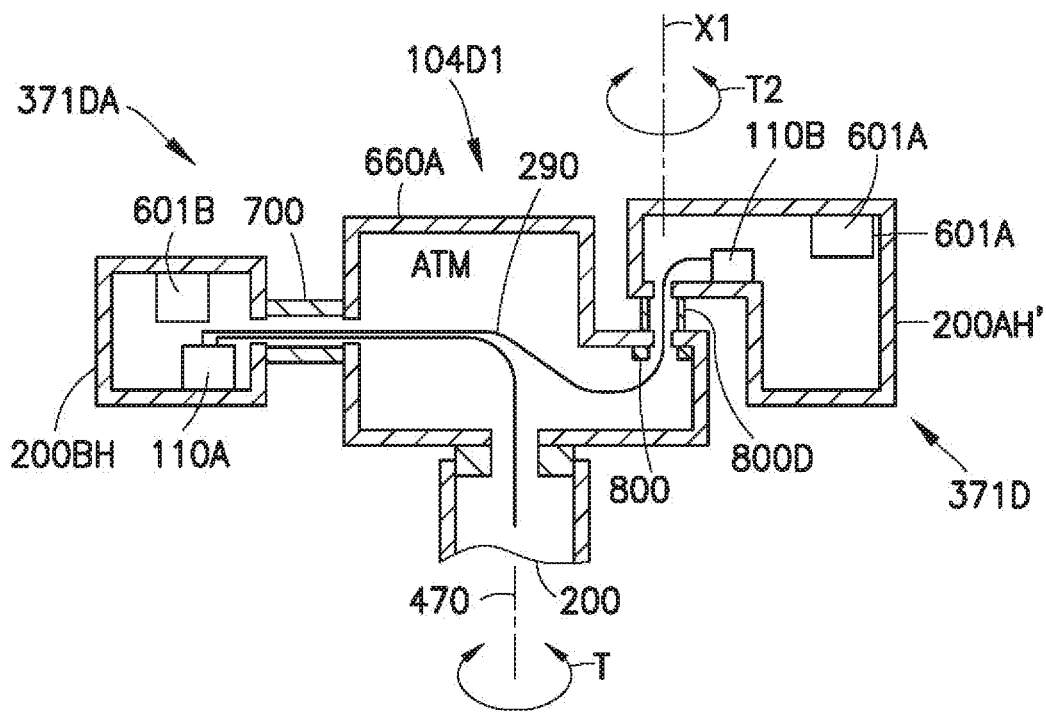

Referring now to FIGS. 8A and 8B one or more of the transfer arm portions 371D, 371DA may be pivotable relative to another one of the drive portions 371D, 371DA for changing the angle β between the axes of extension/retraction R1, R2, R1A, R2A for allowing automatic workpiece centering and/or aligning the axis of extension/retraction with angled facets 100F1-100F8 of a transfer chamber such that the angle β is substantially equal to the angle α, θ between facets (see FIGS. 1A and 1C) for transport substrates to and from processing stations 130 coupled to the facets. For example, the transfer unit module 104D1, which may be substantially similar to one or more transfer unit modules described above, may include a drive interface portion 660A substantially similar to drive interface portion 660. In this aspect the drive interface portion 660A may be configured for coupling to drive housing 200BH of transfer arm portion 371DA in any suitable manner such as, for example, by fixed support member 700. The drive interface portion 660A may also be configured for coupling with drive housing 200AH' (which may be substantially similar to drive housing 200AH described above) of transfer arm portion 371D. Here the drive interface portion 660A may include any suitable drive motor 800 (which may be substantially similar to one or more of the drive motors described above). A drive shaft 800D may extend through a wall of the drive interface portion 660A for coupling to the housing 200AH' so that the transfer arm portion 371D is pivotable about an axis X1 (that is common to each arm of the transfer arm portion 371D) in the direction of arrow T2 for changing the angle β. As may be realized, one or more substrates S held by arms of transfer arm portion 371DA may be centered relative to a substrate holding station (e.g. such as processing stations 130) by, for example, rotating both the transfer arm portion 371DA and the drive interface portion 660A as a unit about common axis 470 while one or more substrates S held by arms of the transfer arm portion 371D may be centered by rotating the transfer arm portion 371D about axis X1.

Figure 8C:
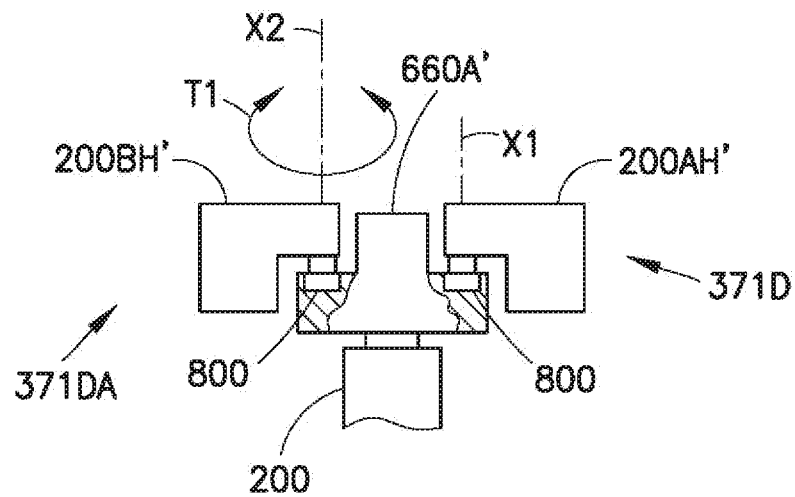
Figure 8D:
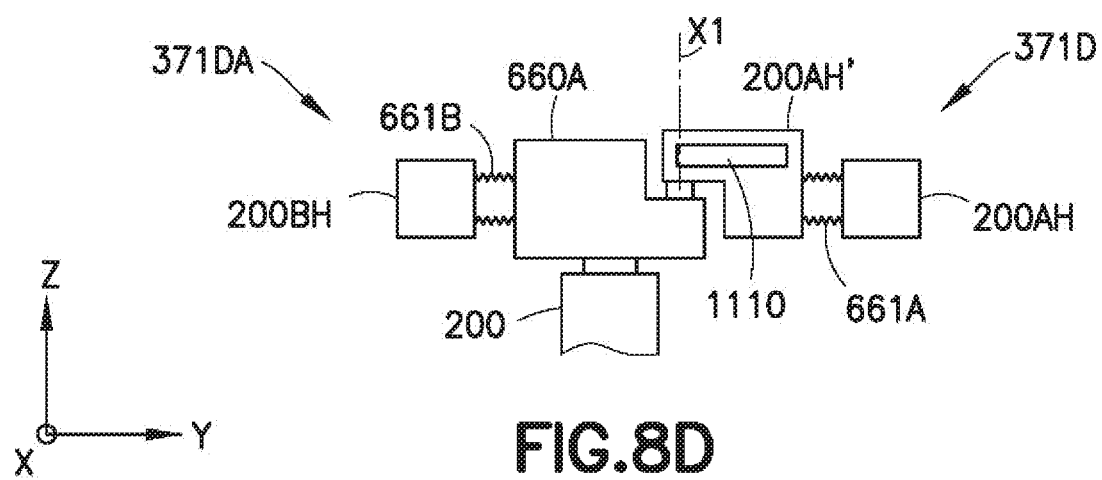

In other aspects, as can be seen in FIG. 8C the drive housings 200AH', 200BH' (which may be substantially similar to drive housing 200AH') of both transfer arm portions 371D, 371DA may be pivotally mounted to the drive interface portion 660A' (which may be substantially similar to base member 660A such that each drive portion is configured to pivot about a respective axis X1, X2 in a respective direction T1, T2 by a respective drive 800 to change the angle β. Here automatic workpiece centering may be performed by rotating one or more of transfer arm portion 371D, 371DA independent of the other by any predetermined amount. In one aspect both transfer arm portions 371D, 371DA may be rotated as a unit about axis 470 while one or more substrates S held by transfer arm portions 371D, 371DA may be centered by rotating one or more transfer arm portions 371D, 371DA about a respective axis X1, X2.

In still other aspects, movement of one or more arms of the transfer arm portions in the direction Y may also be provided in conjunction with rotation of one or more transfer arm portions 371D, 371DA. For example, referring to FIG. 8D the drive interface portion 660A is configured to couple with drive housing 200BH through movable sealing member 661B so as to be movable in the direction Y. In other aspects housing 200BH may be coupled to the drive interface portion by fixed support member 700. Drive housing 200AH' may be pivotally coupled to the drive interface portion 660A in a manner substantially similar to that described above with respect to FIGS. 8A-8C. Drive housing 200AH' may have an aperture to which movable sealing member 661A is coupled and may include a linear drive motor 710 in a manner substantially similar to that described above with respect to drive interface portion 660. Base member 310F1 (FIG. 5F) of transfer arm portion 371D may be coupled to the movable sealing member 661A by drive housing 200AH in a manner substantially similar to that described above. In other aspects both of the transfer arm portions 371D, 371DA may be mounted to drive interface portion 660A in any suitable manner.

Referring now to FIGS. 9A and 9B, in one aspect one or more of the drive housings 200AH, 200BH of transfer arm portions 371D, 371DA may be configured to be rotatably coupled to drive section 200 about common axis 470 so that one or more transfer arm portion 371D, 371DA may be pivoted about common axis 470 for changing the angle β and to, for example, allow automatic workpiece centering. For example, drive housing 200AH" (which maybe be substantially similar to housing 200AH described above) may be substantially directly coupled to a drive shaft 280S of drive section 200 so that as drive shaft 280S rotates the housing 200AH" rotates with the drive shaft 280S. The housing 200BH" (which may be substantially similar to housing 200BH described above) may be rotatably mounted to drive housing 200AH" about common axis 470. For example, any suitable drive 1200 (which may be substantially similar to the drive motors describe above) may be disposed within the drive housing 200AH". The drive housing 200AH" may include an aperture through which a drive shaft 1200S extends and drive housing 200BH" may include an aperture to which the drive shaft 1200S is coupled. As may be realized any suitable seals (such as those described above) may be disposed around the drive shaft, between drive 1200 and drive housing 200AH" and between drive shaft 1200S and drive housing 200BH" for maintaining a sealed atmospheric environment within the housings 200AH", 200BH" and drive section 200. In one aspect any suitable bearings 1200B may also be provided between drive housings 200AH", 200BH" while in other aspects the bearing may not be included such that housing 200BH" is supported by the drive shaft 1200S and the coupling between the drive 1200 and the housing 200AH". Here, drives 280 and 1200 may be independently operable so that the transfer arm portions 371D, 371DA may be pivoted relative to one another in any suitable manner about common axis 470 for changing the angle β. In other aspects one or more of the transfer arm portions 371D, 371DA may be movable along in the direction Y. For example, referring to FIG. 9C a drive housing 200AH''' (which may be substantially similar to drive housing 200AH") may be provided such that the drive housing 200AH is coupled to the drive housing 200AH''' by movable sealing member 661A in a manner substantially similar to that described above with respect to FIG. 8D. Here rotation of one or more drive housing 200AH''' and housing 200BH" allows for adjustment of angle β while movement of drive housing 200AH in the direction Y allows the distance D1, D2 between an the axes of extension/retraction R1, R2, R1A, R2A and the common axis 470 (or the distance D) to be adjusted for automatic workpiece centering.

In accordance with one or more aspects of the disclosed embodiment a transport apparatus includes a frame; a drive section connected to the frame, the drive section having at least one drive axis; at least one arm having an end effector configured for holding a substrate, the at least one arm being connected to the drive section by a transmission link and having at least one degree of freedom axis effecting extension and retraction of the end effector with respect to the at least one arm; and a bearing connected to the frame and the end effector, the bearing defining a guideway that defines the at least one degree of freedom axis.

In accordance with one or more aspects of the disclosed embodiment the bearing comprises a linear bearing.

In accordance with one or more aspects of the disclosed embodiment the transmission link comprises a bi-axially rigid link.

In accordance with one or more aspects of the disclosed embodiment at least one pivoting link connects the bi-axially rigid link to the at least one arm, where the at least one pivoting link is pivotally coupled to the bi-axially rigid link.

In accordance with one or more aspects of the disclosed embodiment the at last one arm includes a pivot joint connecting the at least one arm to the transmission link and a linearly released joint configured to effect linear movement of the end effector along the at least one degree of freedom.

In accordance with one or more aspects of the disclosed embodiment the drive section is a coaxial drive section.

In accordance with one or more aspects of the disclosed embodiment the transmission link comprises a lost motion switch.

In accordance with one or more aspects of the disclosed embodiment the lost motion switch comprises a crank member torqued by the drive section where the crank member is connected to at least one respective arm by a respective drive link.

In accordance with one or more aspects of the disclosed embodiment the at least one arm comprises dual arms connected to a common drive axis of the drive section, each arm having an end effector and a degree of freedom axis effecting extension and retraction of a respective end effector independent of the common drive axis.

In accordance with one or more aspects of the disclosed embodiment the dual arms have an opposing relationship so as to extend in opposite directions for picking and placing substrates.

In accordance with one or more aspects of the disclosed embodiment the dual arms extend in a common direction for picking and placing substrates.

In accordance with one or more aspects of the disclosed embodiment the at least one arm is supported by the transmission link.

In accordance with one or more aspects of the disclosed embodiment the at least one arm is supported by the bearing independent of the transmission link.

In accordance with one or more aspects of the disclosed embodiment the transmission link includes a rigid elbow.

In accordance with one or more aspects of the disclosed embodiment the rigid elbow extends away from the end effector.

In accordance with one or more aspects of the disclosed embodiment an interior of the rigid elbow includes a pivot axis of another transmission link.

In accordance with one or more aspects of the disclosed embodiment a transmission stiffness defines sub-25 micron definition of end effector movement.

In accordance with one or more aspects of the disclosed embodiment the drive section includes a tri-axis drive.

In accordance with one or more aspects of the disclosed embodiment the at least one arm comprises dual arms having a common pivot axis and being connected to a common drive axis of the tri-axis drive, the common drive axis being configured to rotate the dual arms as a unit about the pivot axis.

In accordance with one or more aspects of the disclosed embodiment the at least one arm comprises dual arms where each arm includes a drive axis for independently extending and retracting a respective arm.

In accordance with one or more aspects of the disclosed embodiment the drive section is a five axis drive section with a common pivot axis for all arms of the transport apparatus where a common drive axis of the drive section is connected to all the arms of the transport apparatus and configured to pivot all arms of the transport apparatus about the common pivot axis as a unit.

In accordance with one or more aspects of the disclosed embodiment a process apparatus includes a frame; a drive section having at least two drive axes; multiple arms, each of the multiple arms having a respective end effector and at least one degree of freedom axis independent of other ones of the multiple arms; at least one transmission link connecting the multiple arms to the drive section; and at least one bearing joining the multiple arms to the frame and defining a degree of freedom axis of at least one arm; wherein the at least one transmission and the at least one bearing form a stiff transmission effecting end effector movement along the at least one degree of freedom axis with sub-25 micron definition.

In accordance with one or more aspects of the disclosed embodiment the at least one transmission link includes a lost motion switch link.

In accordance with one or more aspects of the disclosed embodiment the drive section defines a common drive axis that is common to each arm, the at least one degree of freedom axis being independent of the common drive axis.

In accordance with one or more aspects of the disclosed embodiment the drive section is a coaxial rive section.

In accordance with one or more aspects of the disclosed embodiment at least two of the multiple arms have an opposing configuration so as to extend in opposite directions for picking and placing substrates.

In accordance with one or more aspects of the disclosed embodiment at least two of the multiple arms extend in a common direction for picking and placing substrates.

In accordance with one or more aspects of the disclosed embodiment the multiple arms are supported from the at least one transmission link.

In accordance with one or more aspects of the disclosed embodiment the multiple arms are supported from the at least one bearing independent of the at least one transmission link.

In accordance with one or more aspects of the disclosed embodiment each of the at least one transmission link includes a rigid elbow.

In accordance with one or more aspects of the disclosed embodiment the rigid elbow extends away from a respective end effector.

In accordance with one or more aspects of the disclosed embodiment an interior of the rigid elbow includes a pivot axis of another transmission link.

In accordance with one or more aspects of the disclosed embodiment the drive section includes a tri-axis drive.

In accordance with one or more aspects of the disclosed embodiment the multiple arms comprise dual arms having a common pivot axis and being connected to a common drive axis of the tri-axis drive, the common drive axis being configured to rotate the dual arms as a unit about the pivot axis.

In accordance with one or more aspects of the disclosed embodiment the multiple arms comprise dual arms where each arm includes a drive axis for independently extending and retracting a respective arm.

In accordance with one or more aspects of the disclosed embodiment the drive section is a five axis drive section with a common pivot axis for all of the multiple arms where a common drive axis of the drive section is connected to all the multiple arms and configured to pivot all of the multiple arms about the common pivot axis as a unit.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate transport apparatus comprising:
a frame;
a drive section connected to the frame, the drive section having at least one drive axis;
at least two arms each having at least one end effector configured for holding a substrate, each of the at least two arms being connected to the drive section by a respective bi-axially rigid transmission link and having at least one degree of freedom axis effecting extension and retraction of the at least one end effector with respect to a respective one of the at least two arms; and
an anti-friction hearing for each end effector of the at least two arms, each anti-friction hearing being connected to the frame and a respective one of the at least one end effector so as to support respective end effector loading on the anti friction bearing, each anti-friction bearing defining and coinciding with a single guideway that defines, responsive to the respective bi-axially rigid transmission link, a different degree of freedom of the at least one degree of freedom axis for each of the different respective one of the at least two arms so that each anti-friction bearing and its coincident single guideway respectively defines, separate from each other anti-friction bearing and its coincident single guideway, the different degree of freedom corresponding to the at least one degree of freedom axis that effects extension and retraction of the respective one of the at least one end effector for each different respective one of the at least two arms.

2. The substrate transport apparatus of claim 1, wherein the anti-friction bearing comprises a linear bearing.

3. The substrate transport apparatus of claim 1, wherein the drive section is a five axis drive section with a common pivot axis for all arms of the transport apparatus where a common drive axis of the drive section is connected to all the arms of the transport apparatus and configured to pivot all arms of the transport apparatus about the common pivot axis as a unit.

4. The substrate transport apparatus of claim 1, wherein at least one pivoting link connects the bi-axially rigid link to a respective one of the at least two arms, where the at least one pivoting link is pivotally coupled to the bi-axially rigid link.

5. The substrate transport. apparatus of claim 1, wherein each of the at last two arms includes a pivot joint connecting the respective one of the at least two arms to the transmission link and a linearly released joint configured to effect linear movement of the end effector along the at least one degree of freedom.

6. The substrate transport apparatus of claim 1, wherein the drive section is a coaxial drive section.

7. The substrate transport apparatus of claim 1, wherein the transmission link comprises a lost motion switch coupled to two arms of the at least two arms and configured so that the end effector of one of the two arms extends while the end effector of another of the two arms remains retracted.

8. The substrate transport apparatus of claim 7, wherein the lost motion switch comprises a crank member torqued by the drive section where the crank member is connected to at least one respective arm by a respective drive link.

9. The substrate transport apparatus of claim 1, wherein the at least two arms comprises dual arms connected to a common drive axis of the drive section, each arm having an end effector and a degree of freedom axis effecting extension and retraction of a respective end effector independent of the common drive axis.

10. The substrate transport apparatus of claim 9, wherein the dual arms have an opposing relationship so as to extend in opposite directions for picking and placing substrates.

11. The substrate transport apparatus of claim 9, wherein the dual arms extend in a common direction for picking and placing substrates.

12. The substrate transport apparatus of claim 1, wherein each of the at least two arms is supported by the respective transmission link.

13. The substrate transport apparatus of claim 1, wherein the at least two arms is supported by the respective anti-friction bearing independent of the respective transmission link.

14. The substrate transport apparatus of claim 1, wherein the transmission link includes a rigid elbow.

15. The substrate transport apparatus of claim 14, wherein the rigid elbow extends away from the end effector.

16. The substrate transport apparatus of claim 14, wherein an interior of the rigid elbow includes a pivot axis of another transmission link.

17. The substrate transport apparatus of claim 1, wherein a transmission. stiffness of the transmission link defines sub-25 micron definition of end effector movement effecting sub-25 micron repeatability of placement of a substrate held on the end effector at a substrate holding location.

18. The substrate transport apparatus of claim 1, wherein the drive section includes a tri-axis drive.

19. The substrate transport apparatus of claim 18, wherein the at least two arms comprises dual arms having a common pivot axis and being connected to a common drive axis of the tri-axis drive, the common drive axis being configured to rotate the dual arms as a unit about the pivot axis.

20. The substrate transport apparatus of claim 18, wherein the at least two arms comprises dual arms where each arm in a drive axis for independently extending and retracting a respective arm.

21. A substrate transport apparatus comprising:
a frame;
a drive section connected to the frame, the drive section having at least one drive axis;
a first arm having a first end effector configured for holding a substrate;
a second arm having a second end effector configured for holding a substrate, the first arm and the second arm being connected to the drive section by a bi-axially rigid transmission link movably joined to each different first arm and second arm so that the transmission link and each different first arm and second arm move relative to each other and the first arm has at least a first axis having one degree of freedom effecting extension and retraction of the first end effector with respect to the first arm, and the second arm has at least a second axis having one degree of freedom effecting extension and retraction of the second end effector with respect to the second arm;
a first anti-friction bearing connected to the frame and the first end effector, the first anti-friction bearing defining, responsive to the bi-axially rigid transmission link, a single guideway that defines and coincides with at least the first axis having the one degree of freedom of the first arm so that each of the first anti-friction bearing and its coincident single guideway in its entirety coincides with the first axis; and
a second anti-friction bearing connected to the frame and the second end effector, the second anti-friction bearing defining, responsive to the bi-axially rigid transmission link, a single guideway that defines and coincides with at least the second axis having the one degree of freedom of the second arm separate from the first arm so that each of the second anti-friction bearing and its coincident single guideway in its entirety coincides with the second axis.

* * * * *